United States Patent
Isozaki et al.

(10) Patent No.: US 9,252,330 B2
(45) Date of Patent: Feb. 2, 2016

(54) SEMICONDUCTOR LIGHT EMITTING ELEMENT

(75) Inventors: Akihiro Isozaki, Kanagawa (JP); Akira Inoue, Osaka (JP); Atsushi Yamada, Osaka (JP); Toshiya Yokogawa, Nara (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 183 days.

(21) Appl. No.: 13/813,792

(22) PCT Filed: Aug. 5, 2011

(86) PCT No.: PCT/JP2011/004465
§ 371 (c)(1),
(2), (4) Date: Feb. 1, 2013

(87) PCT Pub. No.: WO2012/017685
PCT Pub. Date: Feb. 9, 2012

(65) Prior Publication Data
US 2013/0126902 A1    May 23, 2013

(30) Foreign Application Priority Data
Aug. 6, 2010 (JP) .................................. 2010-177914

(51) Int. Cl.
*H01L 33/32* (2010.01)
*H01L 33/16* (2010.01)
(Continued)

(52) U.S. Cl.
CPC ............... *H01L 33/32* (2013.01); *H01L 33/16* (2013.01); *H01L 33/20* (2013.01); *H01L 33/0079* (2013.01); *H01L 2933/0083* (2013.01)

(58) Field of Classification Search
CPC ......... H01L 33/16; H01L 33/32; H01L 33/20; H01L 33/0079; H01L 2933/0083
See application file for complete search history.

(56) References Cited

U.S. PATENT DOCUMENTS

| 6,555,403 B1* | 4/2003 | Domen ................. B82Y 20/00 257/10 |
| 2005/0169333 A1* | 8/2005 | Watanabe ............... H01L 33/32 372/45.01 |

(Continued)

FOREIGN PATENT DOCUMENTS

| JP | 2001-201746 A | 7/2001 |
| JP | 2001-308462 A | 11/2001 |

(Continued)

OTHER PUBLICATIONS

International Search Report for corresponding International Application No. PCT/JP2011/004465 mailed Aug. 30, 2011.

(Continued)

*Primary Examiner* — Hrayr A Sayadian
(74) *Attorney, Agent, or Firm* — Renner, Otto, Boisselle & Sklar, LLP

(57) ABSTRACT

A semiconductor light-emitting element according to the present invention includes: an n-type nitride semiconductor layer 21; a p-type nitride semiconductor layer 23; an active layer region 22 which includes an m plane nitride semiconductor layer and which is interposed between the n-type nitride semiconductor layer and the p-type nitride semiconductor layer; an n-type electrode 30 which is electrically connected to the n-type nitride semiconductor layer; a p-type electrode 40 which is electrically connected to the p-type nitride semiconductor layer; a light-emitting face, through which polarized light that has been produced in the active layer region is extracted out of this element; and a striped structure 50 which is provided for the light-emitting face and which has a plurality of projections that run substantially parallel to the a-axis direction of the m plane nitride semiconductor layer.

5 Claims, 21 Drawing Sheets

(51) Int. Cl.
*H01L 33/20* (2010.01)
*H01L 33/00* (2010.01)

(56) References Cited

U.S. PATENT DOCUMENTS

| | | | |
|---|---|---|---|
| 2008/0258156 A1 | 10/2008 | Hata | |
| 2009/0065900 A1* | 3/2009 | Saito | H01L 33/16 257/615 |
| 2009/0095973 A1* | 4/2009 | Tanaka | B82Y 20/00 257/99 |
| 2011/0240956 A1* | 10/2011 | Saito | H01L 33/32 257/13 |

FOREIGN PATENT DOCUMENTS

| JP | 2003-332697 A | 11/2003 |
|---|---|---|
| JP | 2008-109098 A | 5/2008 |
| JP | 2008-305971 A | 12/2008 |
| JP | 2009-021349 A | 1/2009 |
| JP | 2009-043832 A | 2/2009 |
| JP | 2009-117641 A | 5/2009 |
| JP | WO 2012/017685 * | 2/2012 |

OTHER PUBLICATIONS

Masui et al., "Optical polarization characteristics of InGaN/GaN light-emitting diodes fabricated on GaN substrates oriented between (100) and (10) planes", Applied Physics Letters 92 (2008) 091105-1-3.

Iwaya et al., "Improvement in light extraction efficiency in group III nitride-based light-emitting diodes using moth-eye structure", Thin Solid Films 515 (2006) pp. 768-770.

Co-pending U.S. Appl. No. 13/813,777, filed Feb. 1, 2013.

* cited by examiner (a)

(b)

(c)

(a)

(b)

(c)

(d)

(a)

(b)

(c)

(a)

(b)

(a)

(b)

(c)

(a)

(b)

(c)

(a)

(b)

SEMICONDUCTOR LIGHT EMITTING ELEMENT

TECHNICAL FIELD

The present invention relates to a nitride-based semiconductor light-emitting element and more particularly relates to a semiconductor light-emitting element, of which the principal surface is an m plane.

BACKGROUND ART

A nitride semiconductor including nitrogen (N) as a Group V element is a prime candidate for a material to make a short-wave light-emitting element because its bandgap is sufficiently wide. Among other things, gallium nitride-based compound semiconductors have been researched and developed particularly extensively. As a result, blue-ray-emitting light-emitting diodes (LEDs), green-ray-emitting LEDs and semiconductor laser diodes made of gallium nitride-based semiconductors have already been used in actual products (see Patent Documents Nos. 1 and 2).

In the following description, gallium nitride based compound semiconductors will be referred to herein as "nitride-based semiconductors". Nitride-based semiconductors include compound semiconductors, of which Ga is replaced either partially or entirely with at least one of aluminum (Al) and indium (In), and are represented by the compositional formula $Al_xGa_yIn_zN$ (where $0 \leq x, y, z \leq 1$ and $x+y+z=1$).

By replacing Ga with Al or In, the band gap can be made either wider or narrower than that of GaN. As a result, not only short-wave light rays such as blue and green rays but also orange and red rays can be emitted as well. That is why by using a nitride-based semiconductor, a light-emitting element that emits a light ray, of which the wavelength is arbitrarily selected from the entire visible radiation range, is realizable theoretically speaking, and therefore, they hope apply such nitride-based semiconductor light-emitting elements to image display devices and illumination units.

A nitride-based semiconductor has a wurtzite crystal structure. FIG. 1 illustrates the planes of a wurtzite crystal structure which are indicated by four indices (i.e., hexagonal indices). According to the four index notation, a crystal plane or orientation is represented by four primitive vectors a1, a2, a3 and c. The primitive vector c runs in the [0001] direction, which is called a "c axis". A plane that intersects with the c axis at right angles is called either a "c plane" or a "(0001) plane". It should be noted that the "c axis" and the "c plane" are sometimes referred to as "C axis" and "C plane". FIG. 2(a) illustrates the crystal structure of a nitride-based semiconductor by ball-stick model and FIG. 2(b) indicates the positions of Ga and N in a nitride-based semiconductor crystal on a plane that intersects with the c-axis at right angles.

In the related art, in fabricating a semiconductor element using nitride-based semiconductors, a c-plane substrate, i.e., a substrate of which the principal surface is a (0001) plane, is used as a substrate on which nitride-based semiconductor crystals will be grown. In that case, as can be seen from FIGS. 2(a) and 2(b), there are a layer in which only Ga atoms are arranged and a layer in which only N atoms are arranged in the c-axis direction. Due to such an arrangement of Ga and N atoms, spontaneous electrical polarization is produced in a nitride-based semiconductor. That is why the "c plane" is also called a "polar plane".

As a result, a piezoelectric field is generated in the c-axis direction in the InGaN quantum well of the active layer of a nitride-based semiconductor light-emitting element. Then, some positional deviation occurs in the distributions of electrons and holes in the active layer. Consequently, due to the quantum confinement Stark effect of carriers, the internal quantum efficiency of the active layer decreases, thus increasing the threshold current in a semiconductor laser diode and increasing the power dissipation and decreasing the luminous efficacy in an LED. Meanwhile, as the density of injected carriers increases, the piezoelectric field is screened, thus varying the emission wavelength, too.

As the In mole fraction of the active layer is increased in order to emit light rays falling within long wavelength ranges such as green, orange and red rays, the intensity of the piezoelectric field further increases and the internal quantum efficiency decreases steeply. That is why in an LED that uses a c-plane active layer, the wavelength of a light ray that can be emitted from it is said to be approximately 550 nm at most.

Thus, to overcome such a problem, people proposed that a light-emitting element be fabricated using a substrate, of which the principal surface is an m plane that is a non-polar plane (which will be referred to herein as an "m plane GaN based substrate"). As shown in FIG. 1, the m plane of a wurtzite crystal structure is one of six equivalent planes that are parallel to the c-axis and that intersects with the c plane at right angles. For example, an m plane may be a (10-10) plane, which is shadowed in FIG. 1 and which intersects with the [10-10] direction at right angles. The other m planes that are equivalent to the (10-10) plane are (−1010), (1-100), (−1100), (01-10) and (0-110) planes. In this case, "-" attached on the left-hand side of a Miller-Bravais index in the parentheses means a "bar".

FIG. 2(c) shows the positions of Ga and N atoms in a nitride-based semiconductor crystal in a plane that intersects with the m plane at right angles. Ga atoms and N atoms are on the same atomic plane as shown in FIG. 2(c), and therefore, no electrical polarization will be produced perpendicularly to the m plane. That is why if a light-emitting element is fabricated using a semiconductor multilayer structure that has been formed on an m plane, no piezoelectric field will be produced in the active layer, thus overcoming the problem described above.

In addition, since the In mole fraction of the active layer can be increased significantly, LEDs and laser diodes which can emit not only a blue ray but also green, orange, red and other rays with longer wavelengths can be made using the same kind of materials.

Furthermore, as disclosed in Non-Patent Document No. 1, for example, an LED which uses an active layer that has been formed on an m plane will have its polarization property affected by the structure of its valence band. More specifically, the active layer formed on an m plane mainly emits a light ray, of which the electric field intensity is biased toward a direction that is parallel to the a-axis. In the present description, a light ray, of which the electric field intensity is biased toward a particular direction, will be referred to herein as a "polarized light ray". For example, a biased light ray, of which the electric field intensity becomes outstandingly high in a direction parallel to the X-axis, will be referred to herein as a "light ray polarized in the X-axis direction" and a direction that is parallel to the X-axis will be referred to herein as "polarization direction". Also, if when a polarized light ray is incident on an interface, the light ray transmitted through the interface is still a polarized light ray, of which the electric field intensity is still as biased as the incident polarized light ray, then the light ray is regarded herein as "maintaining its polarization property".

An LED which uses an active layer that has been formed on an m plane (which will be referred to herein as an "m plane light-emitting element") emits mainly a light ray polarized in the a-axis direction as described above but also emits light rays which are polarized in c- and m-axis directions. However, those light rays that are polarized in the c- and m-axis directions have lower intensities than the light ray polarized in the a-axis direction. That is why in this description, the following discussion will be focused on the light ray polarized in the a-axis direction.

An m plane light-emitting element has such a polarization property, and therefore, is expected to be used as a light-emitting element which can emit a polarized light ray. For example, a liquid crystal display device uses the polarization property of a liquid crystal material, and therefore, needs to use polarized light as its light source. However, as no appropriate light sources that can emit polarized light are available so far, a traditional liquid crystal display device uses a light source such as an LED or a cold cathode fluorescent lamp (CCFL) and has the emitted light passed through a polarizer to obtain polarized light. According to such a configuration, however, most of the light emitted from the light source is cut off by the polarizer, and the light cannot be used efficiently. That is why if an m plane light-emitting element is used as a light source for a liquid crystal display device, then the light can be used far more efficiently, and there is no need to cut down the power consumption of the liquid crystal display device significantly or to provide a polarizer. Consequently, the manufacturing cost can be reduced as well.

CITATION LIST

Patent Literature

Patent Document No. 1: Japanese Laid-Open Patent Publication No. 2001-308462
Patent Document No. 2: Japanese Laid-Open Patent Publication No. 2003-332697
Patent Document No. 3: Japanese Laid-Open Patent Publication No. 2008-305971
Patent Document No. 4: Japanese Laid-Open Patent Publication No. 2008-109098

Non-Patent Literature

Non-Patent Document No. 1: APPLIED PHYSICS LETTERS 92 (2008) 091105
Non-Patent Document No. 2: Thin Solid Films 515 (2008) 768-770

SUMMARY OF INVENTION

Technical Problem

To realize such an m plane light-emitting element, it is important to extract the polarized light that has been emitted from the active layer to an external device with high light extraction efficiency. As disclosed in Non-Patent Document No. 2, traditional light-emitting elements try to increase the light extraction efficiency by providing a random micro structure for the light-emitting face of the light-emitting element. If the light that has come from the active layer is incident on the light-emitting face at an angle that is smaller than the angle of total reflection, then the light cannot be extracted to an external device from the light-emitting face. That is why by providing such a random micro structure, the percentage of light rays that are incident on the emitting facet at angles that are larger than the angle of total reflection can be increased, and therefore, the light extraction efficiency can be increased.

Nevertheless, such a structure is not applicable to a light-emitting element that can emit polarized light. The reason is that in order to extract the polarized light that has been emitted from a light-emitting element such as an m plane light-emitting element while maintaining its polarization direction, the electric field vector direction of the light incident on the light-emitting face (which will be referred to herein as "incident light") and the light incident plane need to intersect with each other at right angles or be parallel to each other. In this description, the "light-emitting face" refers to a facet through which the light emitted from a nitride-based semiconductor light-emitting element is extracted to an external device. On the other hand, the "light incident plane" refers to a plane which is defined by the propagation vector of the incident light and the normal vector of the light-emitting face.

However, if a random micro structure is provided for the light-emitting face, then the relation between the electric field vector directions of the light incident on the micro structure and the light incident plane becomes a random one. As a result, the light transmitted through the micro structure has its polarization direction refracted to various directions and comes to have less biased electric field intensity. That is to say, a tradeoff is inevitable between improvement of the light extraction efficiency and maintaining the polarization property. In other words, as the light extraction efficiency is improved, the electric field intensity becomes less and less biased.

Patent Document No. 3 discloses a technique for minimizing a decrease in light emission efficiency by providing striped grooves which run perpendicularly to the polarization direction of the light emitted from a light-emitting element, which is made of a semiconductor that uses either a non-polar plane or an anti-polar plane as its principal surface. According to Patent Document No. 3, the P-wave component of the light incident on the light-emitting face at a Brewster angle can be transmitted through the light-emitting face without being reflected (i.e., at a reflectance of zero). That is why if the plane that defines the striped groove that runs perpendicularly to the polarization direction of the light to extract is used as the light-emitting face, the polarization direction of the light agrees with the direction of the P-wave component, and therefore, the transmittance of the polarized light should be increased, according to Patent Document No. 3.

Meanwhile, Patent Document No. 4 discloses a light-emitting diode device in which an uneven structure that runs perpendicularly to the polarization direction of the light-emitting element is provided for the light-emitting face as in Patent Document No. 3 in order to improve the distribution of the light extracted.

However, when the present inventors inspected closely the light-emitting element disclosed in Patent Document No. 3, the present inventors discovered that the electric field intensity of the light extracted was less biased. That is to say, the present inventors discovered that it is difficult to extract the light while maintaining its polarization property sufficiently according to the structure of Patent Document No. 3.

The present inventors also discovered via experiments that the light-emitting elements disclosed in Patent Documents Nos. 3 and 4 had significantly asymmetric light distribution characteristics.

The present inventors perfected our invention in order to overcome at least one of these problems with the related art, and an object of the present invention is to provide, first and foremost, a semiconductor light-emitting element that can increase the light extraction efficiency while maintaining polarization property. Another object of the present invention is to provide a semiconductor light-emitting element that can emit polarized light with the light distribution characteristic improved.

Solution to Problem

A semiconductor light-emitting element according to the present invention includes: an n-type nitride semiconductor layer; a p-type nitride semiconductor layer; an active layer region which includes an m plane nitride semiconductor layer and which is interposed between the n-type nitride semiconductor layer and the p-type nitride semiconductor layer; an n-type electrode which is electrically connected to the n-type nitride semiconductor layer; a p-type electrode which is electrically connected to the p-type nitride semiconductor layer; a light-emitting face, through which polarized light that has been produced in the active layer region is extracted out of this element; and a striped structure which is provided for the light-emitting face and which has a plurality of projections that run substantially parallel to the a-axis direction of the m plane nitride semiconductor layer.

In one embodiment, the plurality of projections have at least one slope which is not parallel to the light-emitting face.

In one embodiment, the polarized light is produced in the active layer region so as to have a light distribution characteristic, of which the angle of radiation is wider in a c-axis direction than in the a-axis direction.

In one embodiment, the semiconductor light-emitting element further includes an n-type nitride semiconductor substrate which has first and second principal surfaces, the first principal surface is in contact with the n-type nitride semiconductor layer, and the light-emitting face is the second principal surface.

In one embodiment, the p-type nitride semiconductor layer has first and second principal surfaces, the second principal surface is located closer to the active layer region, and the light-emitting face is the first principal surface.

In one embodiment, the semiconductor light-emitting element further includes: an n-type nitride semiconductor substrate which is provided in contact with the n-type nitride semiconductor layer; and a light output member which has first and second principal surfaces. The first principal surface is in contact with the other surface of the n-type nitride semiconductor substrate which is opposite from the surface that contacts with the n-type nitride semiconductor layer. And the light-emitting face is the second principal surface.

In one embodiment, the light output member has a refractive index of greater than one.

In one embodiment, the angle formed between a direction in which the plurality of projections run and the a-axis direction is within ±3 degrees.

In one embodiment, the plurality of projections have a period of 300 nm to 8 μm.

A method for fabricating a semiconductor light-emitting element according to the present invention includes the steps of: forming a semiconductor multilayer structure on a substrate, the multilayer structure including an n-type nitride semiconductor layer, a p-type nitride semiconductor layer, and an active layer region which is interposed between the n-type and p-type nitride semiconductor layers and which includes an m plane nitride semiconductor layer; forming an re-type electrode which is electrically connected to the n-type nitride semiconductor layer and a p-type electrode which is electrically connected to the p-type nitride semiconductor layer; and forming a striped structure, including a plurality of projections that run substantially parallel to an a-axis direction of the m plane nitride semiconductor layer, on another surface of the substrate on which the semiconductor multilayer structure has not been formed.

Advantageous Effects of Invention

In a semiconductor light-emitting element according to the present invention, a striped structure that runs substantially parallel to the a-axis is provided for the light-emitting face through which the light emitted from the active layer region is extracted. Thus, the light polarized in the a-axis direction can be incident as light made essentially of s-wave components on the slope and upper surface of the projections that form the striped structure. As a result, the polarized light can be extracted more efficiently to an external device while maintaining the polarization property. In addition, since the light polarized in the a-axis direction gets refracted at the boundary between the slope of the projections and the outside so as to go closer to the m-axis, the degree of asymmetry of the light distribution characteristic can be improved as well.

DESCRIPTION OF EMBODIMENTS

Figure 1:
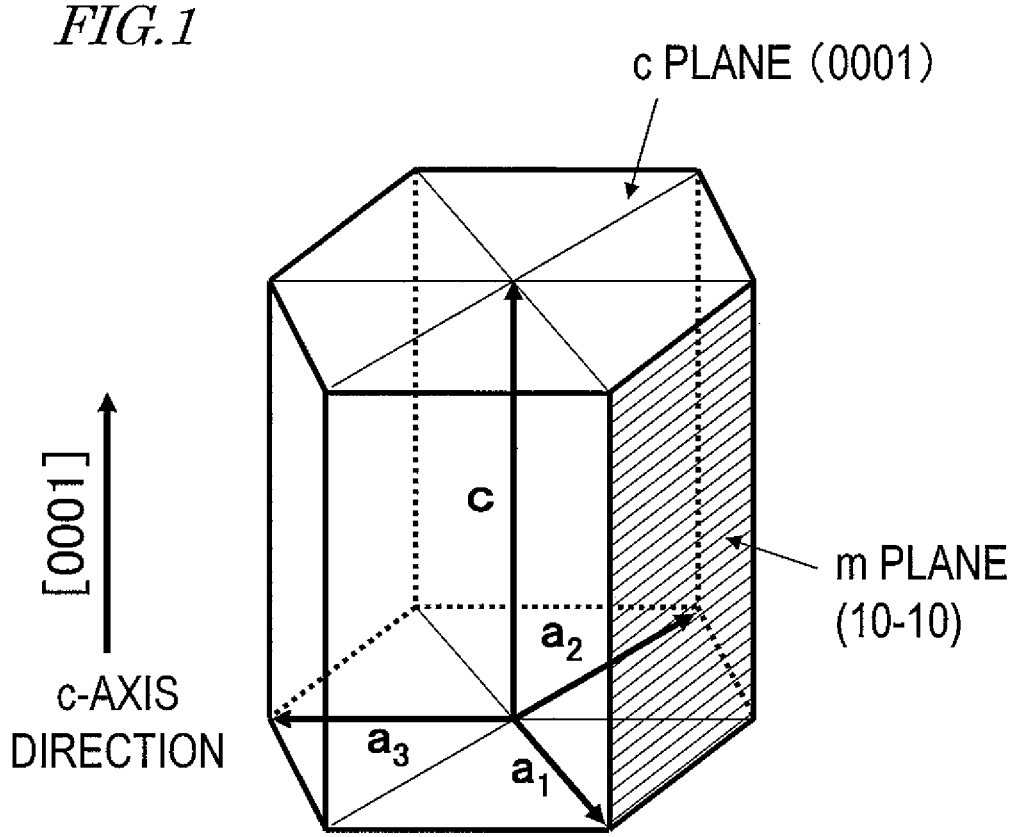
FIG. 1 is a perspective view showing four primitive vectors a1, a2, a3 and c representing a wurtzite crystal structure.
Figure 2:
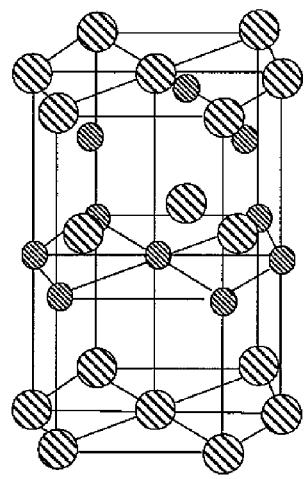
FIG. 2(a) is a perspective view schematically illustrating a unit cell of GaN and (b) and (c) illustrate the crystal structures of a c plane and an m plane, respectively.
Figure 2:
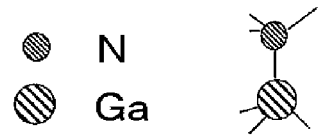
Figure 2:
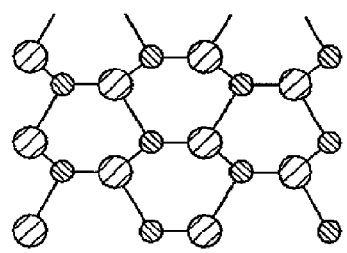
Figure 2:
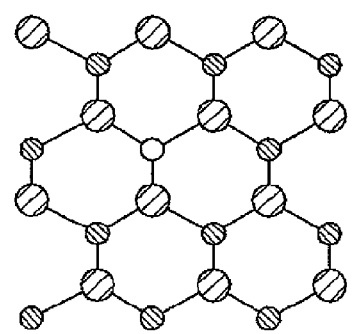

The present inventors carried out an extensive research on the relation between the light-emitting face and the polarization and light distribution characteristic of the light emitted from an active layer in an m plane nitride-based semiconductor light-emitting element. As a result, the present inventors discovered that the polarization property of the extracted light should depend on the relation between the direction of the major electric field vector of the polarized light produced in the active layer of the nitride-based semiconductor light-emitting element and the shape of the light-emitting face. The present inventors also discovered that the light distribution characteristic of the light extracted should depend on the relation between the direction of the major propagation vector of the polarized light and the shape of the light-emitting face. And based on these discoveries, the present inventors invented a nitride-based semiconductor light-emitting element that can increase the efficiency to extract the light while maintaining its polarization property and that could improve its light distribution characteristic at the same time by optimizing the shape of the light-emitting face. Hereinafter, embodiments of a light-emitting element according to the present invention will be described with reference to the accompanying drawings. In the following description, any pair of components shown in multiple drawings and having substantially the same function will be identified by the same reference numeral for the sake of simplicity. It should be noted that the present invention is in no way limited to the embodiments to be described below.

Embodiment 1

Figure 3:
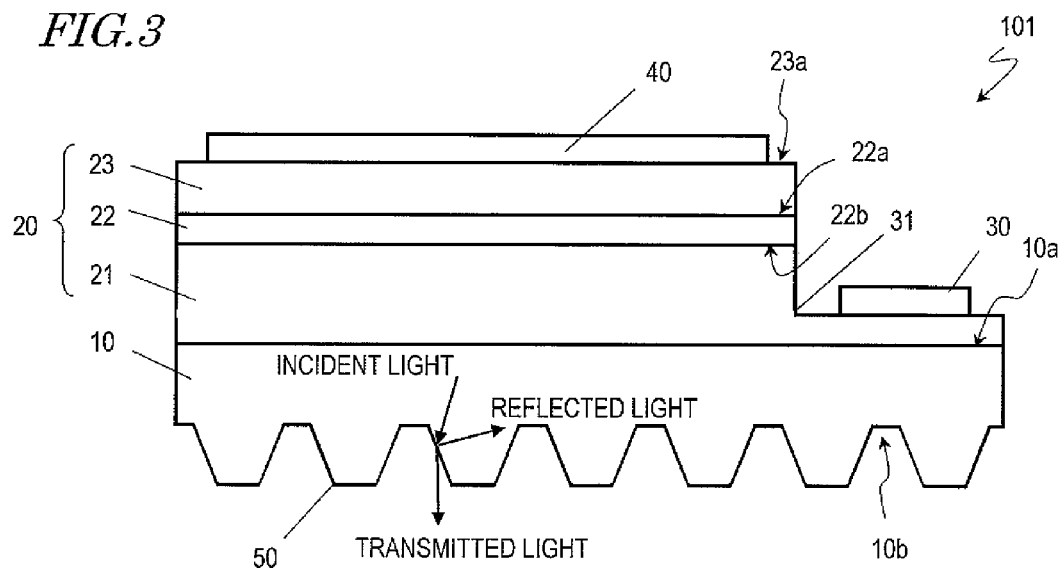
FIG. 3 is a schematic cross-sectional view illustrating a first embodiment of a semiconductor light-emitting element according to the present invention.

FIG. 3 schematically illustrates a cross-sectional structure of a semiconductor light-emitting element according to a first embodiment of the present invention. As shown in FIG. 3, the semiconductor light-emitting element 101 includes a substrate 10 and a semiconductor multilayer structure 20 which has been formed on the substrate 10 and which includes an active layer region 22. As will be described in detail later, this semiconductor light-emitting element 101 emits polarized light that has been produced in an active layer, of which the principal surface is an m plane of a nitride-based semiconductor. Thus, this semiconductor multilayer structure 20 includes an active layer region 22, of which the principal surface is an m plane, and is made of a nitride semiconductor, more specifically, an $Al_xIn_yGa_zN$ (where $x+y+z=1$, $x \geq 0$, $y \geq 0$ and $z \geq 0$) semiconductor.

The semiconductor multilayer structure 20 includes not only the active layer region 22 but also an n-type nitride semiconductor layer 21 and a p-type nitride semiconductor layer 22. And the active layer region 22 is interposed between the n-type nitride semiconductor layer 21 and the p-type nitride Semiconductor layer 22. Although not shown in FIG. 3, an undoped GaN layer may be further provided between the active layer region 22 and the p-type nitride semiconductor layer 23.

The semiconductor light-emitting element 101 further includes an n-type electrode 30 and a p-type electrode 40, which are electrically connected to the n-type nitride semiconductor layer 21 and the p-type nitride semiconductor layer 23, respectively. In this embodiment, by making a recess 31 in the semiconductor multilayer structure 20, the n-type nitride semiconductor layer 21 is partially exposed and the n-type electrode 30 is arranged on that exposed part of the n-type nitride semiconductor layer 21. The n-type electrode 30 may be a stack (Ti/Pt) of Ti and Pt layers, for example. Meanwhile, the p-type electrode 40 is arranged on the p-type nitride semiconductor layer 23. The p-type electrode 40 suitably covers almost the entire surface of the p-type nitride semiconductor layer 23. The p-type electrode 40 may be a stack (Pd/Pt) of Pd and Pt layers, for example.

As for the substrate 10, a member on which the semiconductor multilayer structure 20 can be formed suitably is selected. Specifically, the substrate 10 does not have to be a GaN substrate but may also be a gallium oxide substrate, an SiC substrate, an Si substrate or a sapphire substrate, for example. To grow epitaxially the semiconductor multilayer structure 20 including the active layer region, of which the principal surface is an m plane, on the substrate 10, the plane orientation of the SiC or sapphire substrate is suitably an m plane, too. However, it was reported that a-plane GaN could grow on an r-plane sapphire substrate. That is why to grow the active layer region 22, of which the principal surface is an m plane, the surface of the substrate 10 does not have to be an m plane. Optionally, after the semiconductor multilayer structure 20 has been formed on another substrate, instead of this substrate 10, the semiconductor multilayer structure 20 may be removed from that another substrate and transferred onto this substrate 10.

The n-type nitride semiconductor layer 21 may be made of n-type $Al_uGa_vIn_wN$ (where u+v+w=1, u≥0, v≥0 and w≥0), for example. As the n-type dopant, silicon (Si) may be used, for example.

The p-type nitride semiconductor layer 23 may be made of a p-type $Al_sGa_tN$ (where s+t=1, s≥0 and t≥0) semiconductor, for example. As the p-type dopant, magnesium (Mg) may be used, for example. Examples of other p-type dopants include zinc (Zn) and beryllium (Be). In the p-type nitride semiconductor layer 23, the mole fraction s of Al may be either constant in the thickness direction or vary continuously or stepwise in the thickness direction. Specifically, the p-type nitride semiconductor layer 23 may have a thickness of approximately 0.2 μm to 2 μm.

In the p-type nitride semiconductor layer 23, in the vicinity of the first principal surface 23a (i.e., in the vicinity of the interface with the p-type electrode 40), the mole fraction s of Al is suitably equal to zero, i.e., the p-type nitride semiconductor layer 23 is suitably made of GaN there. In that case, the GaN portion is heavily doped with a p-type dopant and suitably functions as a contact layer. Although not shown in FIG. 3, a contact layer of $p^+$-GaN may be provided between the p-type nitride semiconductor layer 23 and the p-type electrode 40.

The active layer region 22 is the light-emitting region of this semiconductor light-emitting element 101 and includes a nitride semiconductor layer which has been formed on an m plane in order to realize good polarization property and to emit polarized light with high luminous efficacy. The growing direction of this active layer region 22 is perpendicular to an m plane and the first and second principal surfaces 22a and 22b of the active layer region are both m planes. However, the first and second principal surfaces 22a and 22b do not have to be perfectly parallel to the m plane but may define a predetermined tilt angle with respect to the m plane. Specifically, the tilt angle is defined to be the angle formed between a normal line to the first or second principal surface 22a or 22b and a normal line to the m plane. The absolute value of the tilt angle θ may be 5 degrees or less, and is suitably 1 degree or less, in both the c- and a-axis directions. If the tilt angle falls within such a range, the first or second principal surface 22a or 22b of the active layer region is tilted overall with respect to the m plane but should be made up of a number of steps, each of which is as high as one to a few atomic layers, and should include a lot of m plane regions, speaking microscopically. That is why a plane that defines a tilt angle of 5 degrees or less (in absolute value) with respect to the m plane should have the same property as the m plane. Thus, the m plane nitride semiconductor layer of this embodiment includes a nitride semiconductor layer that has been formed on a surface which defines a tilt angle of 5 degrees or less (in absolute value) with respect to an m plane. If the absolute value of the tilt angle θ were greater than 5 degrees, then the internal quantum efficiency would decrease due to a piezoelectric field. For that reason, the absolute value of the tilt angle θ is set to be 5 degrees or less.

The active layer region 22 has a GaInN/GaN multiple quantum well (MQW) structure in which $Ga_{1-x}In_xN$ well layers (where 0<x<1), each of which is an m plane nitride semiconductor layer with a thickness of approximately 3 nm to 20 nm, and GaN barrier layers, each having a thickness of approximately 5 nm to 30 nm, are stacked alternately. The wavelength of the light emitted from the semiconductor light-emitting element 101 is determined by the magnitude of the band gap of the semiconductor that forms the active layer region 22, more specifically, the In mole fraction x of the composition $Ga_{1-x}In_xN$ of the semiconductor that forms the well layers. No piezoelectric field is generated in the active layer region 22 that has been formed on an m plane. That is why even if the In mole fraction is increased, decrease in luminous efficacy can be minimized. As a result, by increasing the In mole fraction significantly, even a light-emitting element that uses a nitride-based semiconductor also realizes a red-ray-emitting light-emitting diode. In addition, by using the active layer region 22 that has been formed on an m plane, light polarized in the a-axis direction can be emitted.

The substrate 10 has first and second principal surfaces 10a and 10b, and the first principal surface 10a is in contact with the n-type nitride semiconductor layer 21 of the semiconductor multilayer structure 20. The second principal surface 10b becomes a light-emitting face, through which the polarized light emitted from the active layer region 22 is extracted. In this embodiment, the second principal surface 10b has a striped structure 50. Hereinafter, the striped structure 50 will be described in detail.

Figure 4:
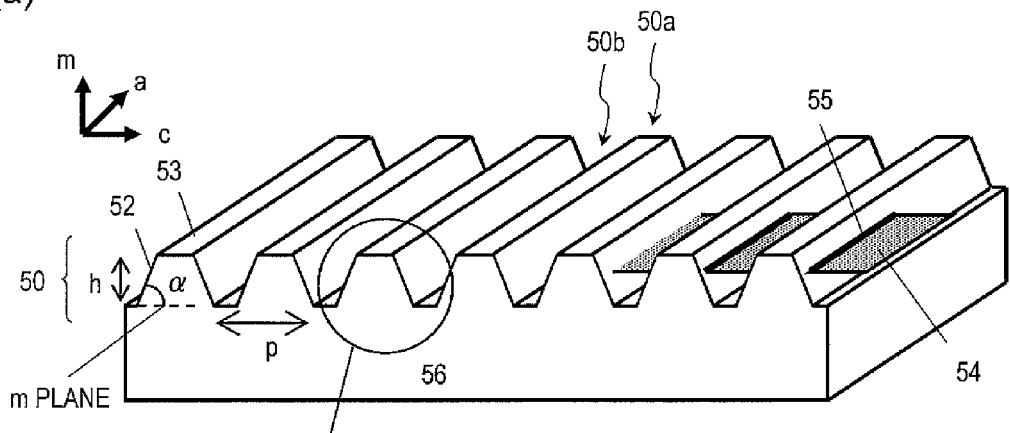
FIG. 4(a) is a perspective view illustrating the striped structure of the first embodiment, (b) is a schematic cross-sectional view illustrating a projection of the striped structure, and (c) and (d) are schematic top views showing the direction in which the stripes run.
Figure 4:
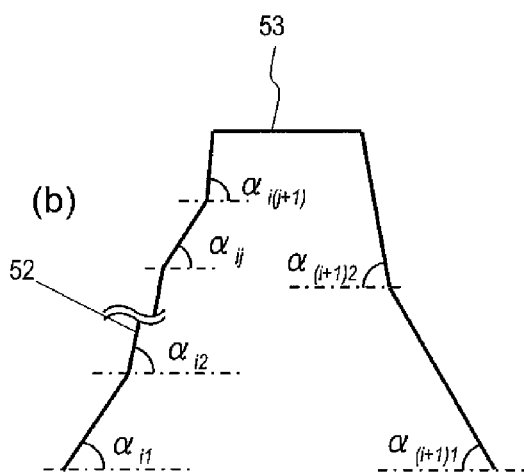
Figure 4:
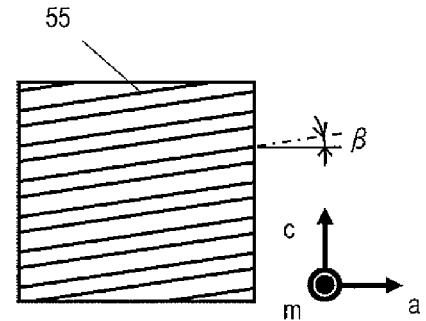
Figure 4:
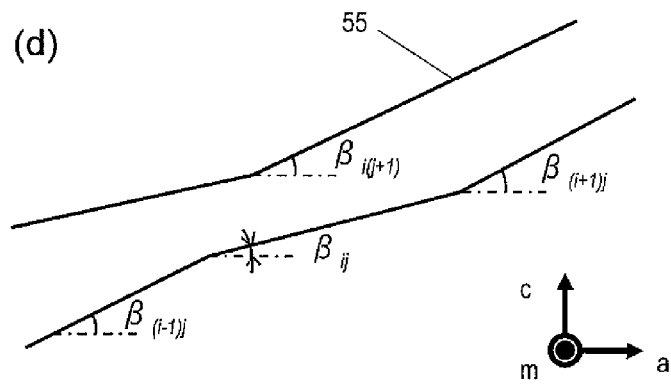

FIG. 4(a) is a perspective view schematically illustrating the striped structure 50. At the upper left corner of FIG. 4(a), shown are the crystal axis directions of the m plane nitride semiconductor layers included in the active layer region 22. As shown in FIG. 4(a), the striped structure 50 has a plurality of projections (raised portions or ridges) 50a which run parallel to the a-axis of the m plane nitride semiconductor layers. The second principal surface 10b with this striped structure 50, i.e., the light-emitting face, is parallel to the a- and c-axes and intersects with the m-axis at right angles.

As a plurality of grooves 50b runs parallel to the a-axis between those projections 50a, it can also be said that this striped structure 50 has these grooves 50b. In this description, however, in order to discuss the polarized light to be extracted through a member with this striped structure 50, the striped structure 50 is regarded herein as having those "projections". However, those "projections" may be formed in the striped structure 50 by cutting those "grooves" through the light-emitting face.

In this embodiment, each projection 50a has an upper surface 53 which is parallel to the second principal surface 10b that is the light-emitting face and at least one slope 52 which is not parallel to the light-emitting face. However, each projection 50a has only to have at least one slope 52 which is not parallel to the second principal surface 10b. Also, as will be described later, the slope 52 may also be curved. The height h of each projection 50a is suitably equal to or greater than $\lambda/(4\times n)$ and more suitably falls within the range of $\lambda/(4\times n)$ to 10 μm, where λ is the emission wavelength of the active layer region 22 and n is the refractive index of the material of the striped structure 50. In this embodiment, n is the refractive index of the material of the substrate 10. For example, supposing the polarized light produced in the active layer region 22 has a wavelength of 450 nm and the material of the striped structure 50 has a refractive index n of 2.5, the height h is suitably equal to or greater than 45 nm.

By setting the height h to be equal to or greater than $\lambda/(4\times n)$, the striped structure 50 can increase the light extraction efficiency. The upper limit of the height h depends on the manufacturing method adopted. For example, if a chemical dry etching process is adopted, the slope of the striped structure is likely to produce crystal planes which form α=approximately 65 degrees, and therefore, the striped structure comes to have an aspect ratio of approximately 1.2. In this example, the aspect ratio is represented as the ratio of the height h of the striped structure 50 to the length b of the bottom of the striped structure 50. This aspect ratio is given by the following Equation (10):

$$\text{aspect ratio} = \text{height } h/\text{bottom length } b \quad (10)$$

In this case, if the bottom length b is 10 μm, then the upper limit of the height h becomes 12 μm. In this description, the chemical dry etching process means a dry etching process to be carried out under plasma which is highly chemically reactive to a nitride semiconductor (such as chlorine radicals).

On the other hand, if a physical dry etching process is adopted, then the aspect ratio of the striped structure can be increased to approximately 5. In this case, if the bottom length b is 10 μm, then the height h becomes 50 μm. In this description, the physical dry etching process means a dry etching process to be performed physically on a nitride semiconductor under plasma (such as chlorine ions).

Actually, however, the height h cannot be equal to or greater than the thickness of the substrate. Also, the height h is suitably set to be approximately equal to or smaller than a half of the thickness of the substrate. Then, even after the striped structure has been formed, the substrate can maintain its rigidity and can be handled with no problem at all.

The angle α formed between the m plane (which is either the light-emitting face or the second principal surface) and the slope 52 of the striped structure 50 (which will be simply referred to herein as an "angle α") suitably satisfies (90 degrees−$\theta_c$)/2<α<90 degrees, where θc is the critical angle of the light incident on this striped structure 50. The light that has been incident at an angle larger than the critical angle θc is totally reflected and the transmittance becomes equal to zero. FIG. 4(b) generally illustrates a cross-sectional structure 56 of a single projection 50a of the striped structure 50 as viewed perpendicularly to the longitudinal direction (i.e., perpendicularly to the direction in which the projection 50a runs). As shown in FIG. 4(b), the slope 52 may have a plurality of slope portions. If the angle defined by each of those slope portions with respect to the m plane is $\alpha_{ij}$ (where i and j are integers and satisfy 0≤i, j≤∞), then $\alpha_{ij} \neq \alpha_{lm}$ (where i≠l or j≠m and 0≤l, m≤i, j) may be satisfied. $\alpha_n$ is the angle formed between the $j^{th}$ slope portion as counted from the root of the projection 50a and the m plane (which is either the light-emitting face or the second principal surface) in the $i^{th}$ one of the slopes 52 that are arranged in the c-axis direction. Optionally, a single projection 50a may have multiple different cross-sectional shapes 56 in its longitudinal direction.

However, it is recommended that the area of the slope 52 that satisfies 0 degrees<$\alpha_{ij}$≤90 degrees and (90 degrees−$\theta_c$)/2<$\alpha_{ij}$<90 degrees is larger than that of another slope 52 that satisfies either 0 degrees<$\alpha_{ij}$≤(90°−$\theta_c$)/2 or 90 degrees≤$\alpha_{ij}$<150 degrees. As will be described in detail later, part of the light that has been incident on the slope 52 that satisfies (90 degrees−$\theta_c$)/2<$\alpha_{ij}$<90 degrees at an angle larger than the critical angle $\theta_c$ is totally reflected from the slope 52 and is incident on another slope 52 at an angle that is equal to or smaller than the critical angle $\theta_c$. As a result, the light can be extracted out of this nitride-based semiconductor light-emitting element 100 at a smaller number of times of reflection (i.e., the light extraction efficiency further increases) and the polarization property can be maintained.

Figure 5:
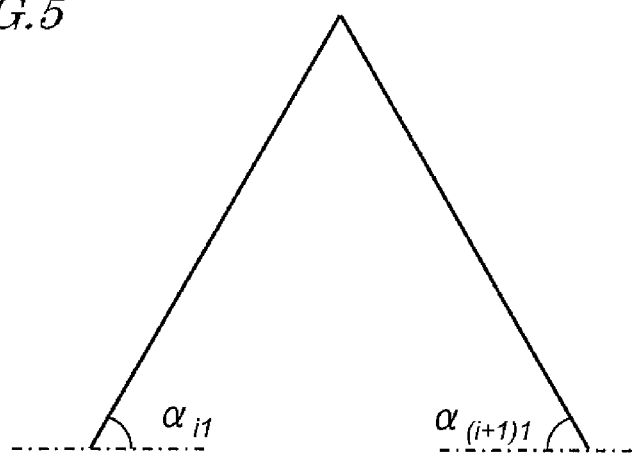
FIG. 5(a) through (c) are schematic cross-sectional views illustrating exemplary projections of the striped structure.
Figure 5:
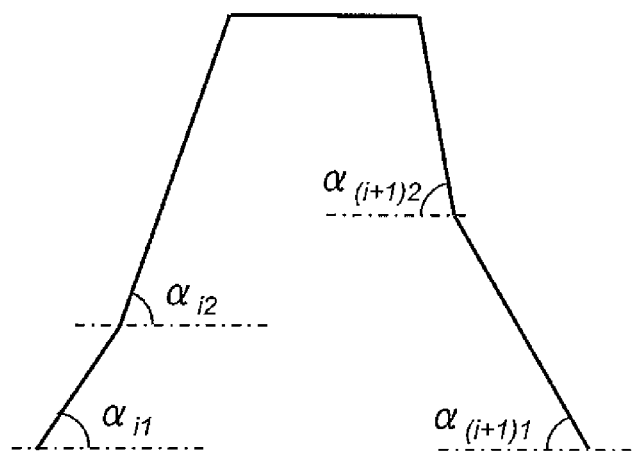
Figure 5:
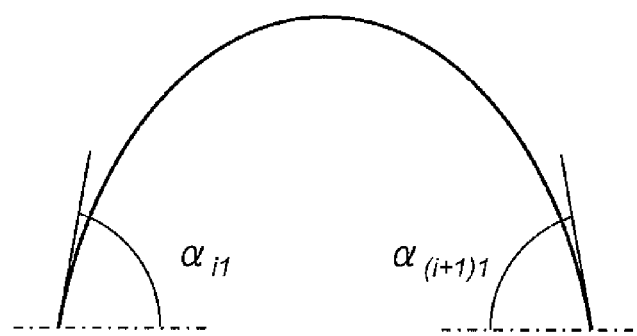

Examples of such cross-sectional shapes 56 that satisfy the condition on $\alpha_{ij}$ include a triangular shape such as the one shown in FIG. 5(a) and a horizontally asymmetric shape such as the one shown in FIG. 5(b). Also, if j=∞ (i.e., if the slope 52 is made up of a lot of very small sloped portions with different $\alpha_{ij}$), then the cross-sectional shape 56 will be a partially curved shape including a portion of a circle or an ellipse as shown in FIG. 4(c). Furthermore, the projections 50a that form the striped structure 50 do not have to be arranged at regular intervals but may have their pitch p modulated. Even so, the effects of this application can also be achieved. Moreover, not every projection 50a has to have the same height h but some projections 50a may have mutually different heights.

Figure 6:
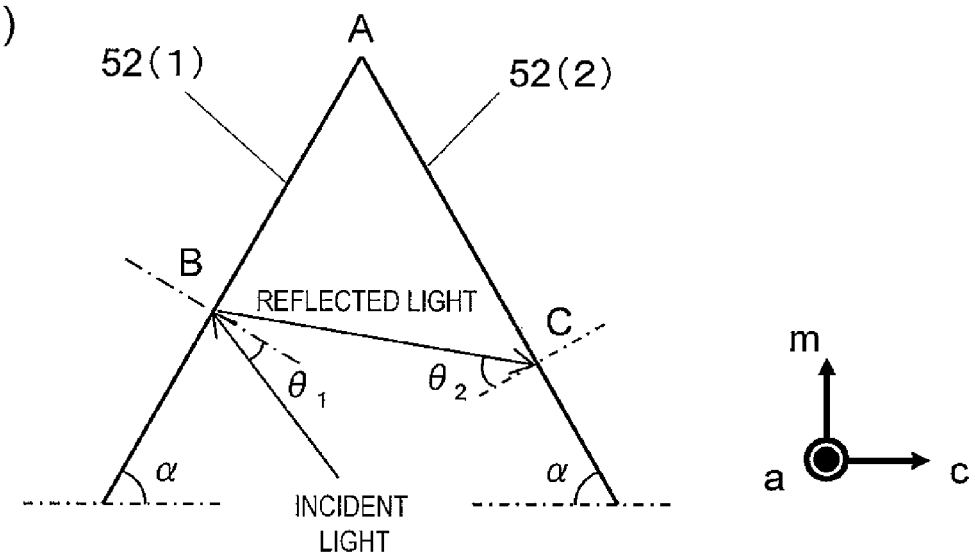
FIG. 6(a) shows an example of light incident on a striped structure and its reflected light, and (b) shows a relation between the angle defined by a slope of the striped structure and the angle of incidence of the reflected light.
Figure 6:
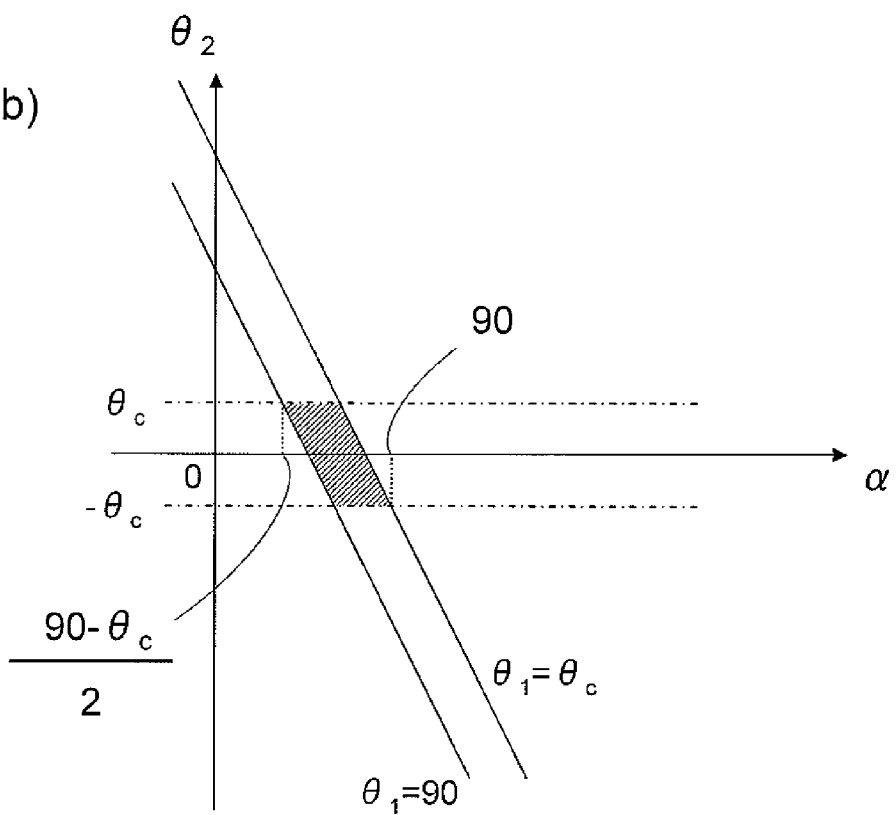

Hereinafter, it will be described in detail why the light can be extracted out of this semiconductor light-emitting element 101 at a small number of times of reflection when $\alpha_{ij}$ falls within the range (90 degrees−θc)/2<$\alpha_{ij}$<90 degrees. FIG. 6(a) schematically illustrates the light that has been incident on a slope 52(1) of a horizontally symmetric striped structure 50 at an angle of incidence $\theta_1$ and its reflected light. As shown in FIG. 6(a), the reflected light is then incident on another slope 52(2), which is not the slope 52(1), at an angle of incidence $\theta_2$. Suppose that a vertex of the striped structure 50 is a point A, that the intersection between the incident light and the slope 52(1) is a point B, and that the intersection between the reflected light and the slope 52(2) is a point C. In that case, based on the sum of the interior angles of the triangle ABC, the following Equation (1) is satisfied:

$$\theta_2 = -2\alpha + (180 - \theta_1) \quad (1)$$

Suppose the light that has been incident on the slope 52(1) at an angle $\theta_1$ that is equal to or smaller than the critical angle $\theta_c$ is not reflected but transmitted through the slope 52(1) to outside of this semiconductor light-emitting element 101. In other words, to produce the reflected light, $\theta_1$ needs to fall within the range $\theta_c < \theta_1 < 90$ degrees (which will be referred to herein as "condition $\theta_1$"). On the other hand, to get the light reflected from the slope 52(1) transmitted through the slope 52(2), $\theta_2$ needs to fall within the range $-\theta_c < \theta_2 < \theta_c$ (which will be referred to herein as "condition $\theta_2$"). If the condition $\theta_1$ is arranged based on the relation defined by Equation (1), then α and $\theta_2$ that satisfy the conditions $\theta_1$ and $\theta_2$ are indicated by the shadowed region shown in FIG. 6(b). Thus, it can be seen that the range of the angle α in which the conditions $\theta_1$ and $\theta_2$ are satisfied and in which there is $\theta_1$ is (90 degrees−$\theta_c$)/2<α<90 degrees. If a half or more of the slopes 52 that form the striped structure 50 satisfy this range of the angle α, a sufficient quantity of light can be extracted out of this semiconductor light-emitting element 101 through the slope 52.

In order to minimize scattering the transmitted light, the slope 52 and the upper surface 53 are suitably as smooth as possible. That is why the surface unevenness on the slope 52 and the upper surface 53 should be less than λ/(4×n).

FIG. 4(c) is a schematic top view of the striped structure 50. The direction in which the projections 50a of the striped structure 50 run is suitably substantially parallel to the a-axis. In this description, to be "substantially parallel" means that the angle β formed between the direction in which the projections 50a of the striped structure 50 run and the a-axis is within ±3 degrees. The angle β is supposed to be the angle defined by the line of intersection 55 between the shadowed plane 54 shown in FIG. 4(a) and the slope 52 (i.e., the direction in which the projections 50a of the striped structure 50 run) with respect to the a-axis. The a-axis of the nitride semiconductor can be determined by reference to the orientation flat defined for the substrate 10. However, when the orientation flat is determined during the process step of making the substrate 10, error could be caused in orientation. In addition, when the striped structure 50 is formed on the substrate 10, an orientation error could also be caused in the direction in which the projections 50a of the striped structure 50 run. These errors roughly fall within the ranges defined above. Also, if those errors fall within those ranges, significant effects of the present invention can be achieved as will be described later with respect to specific examples of the present invention.

Figure 7:
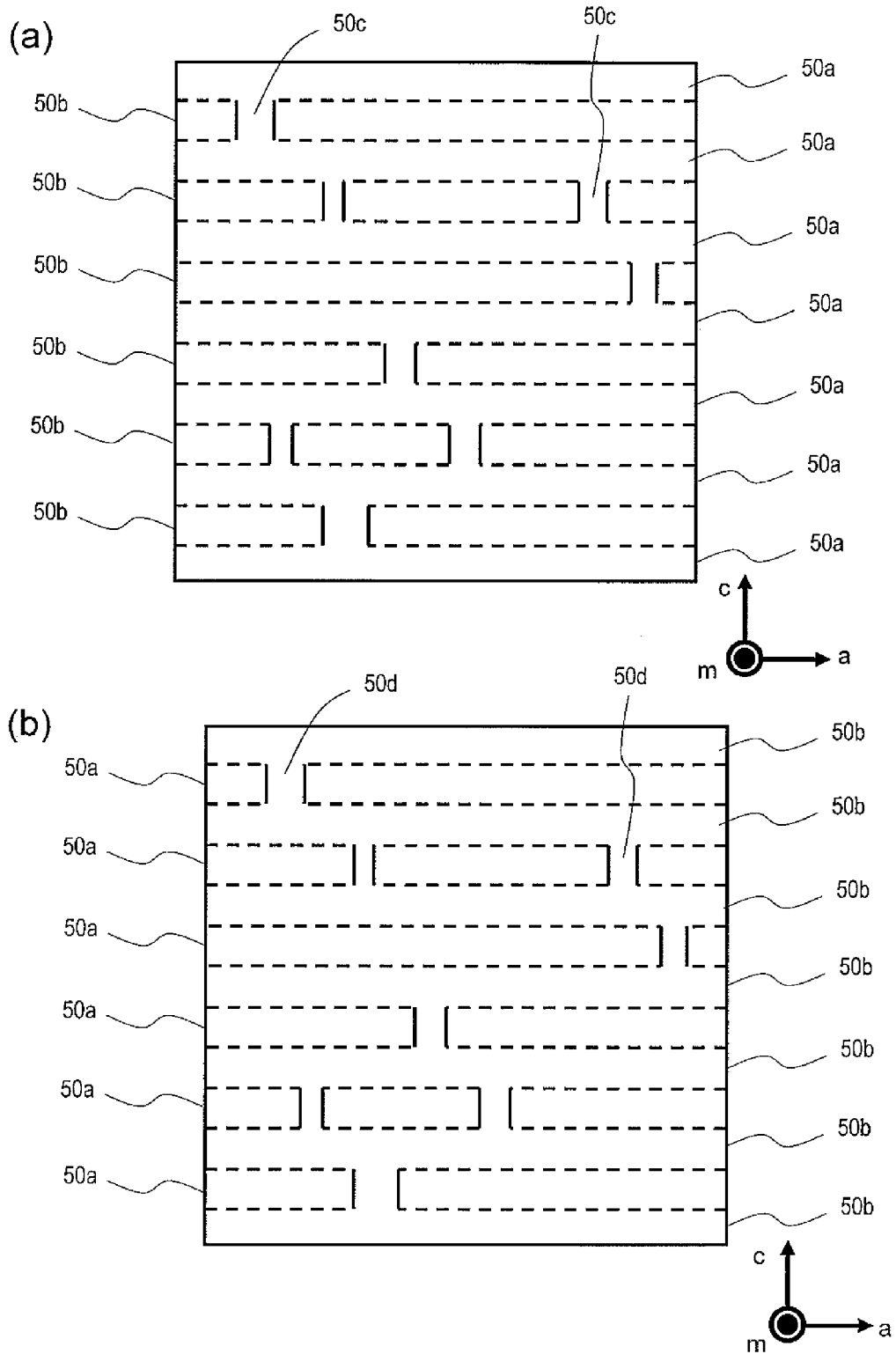
FIGS. 7(a) and (b) are schematic top views illustrating other examples of the striped structure.

The plane 54 is parallel to a plane defined by the a- and c-axes (which will be referred to herein as an "ac plane") and is present where the plane 54 intersects with the slope 52. FIG. 4(d) is an enlarged view illustrating a portion of FIG. 4(c) on a larger scale. As shown in FIG. 4(d), the line 55 does not have to be a single straight line but may also be made up of a plurality of line segments which define mutually different angles with respect to the a-axis. In this case, if the angle defined by each of those line segments of the line 55 with respect to the a-axis is supposed to be $\beta_{ij}$ (where i and j are integers and satisfy $0 \leq i, j \leq \infty$) as shown in FIG. 4(d), then $\beta_{ij} \neq \beta_{lm}$ (where $i \neq l$ or $j \neq m$ and $0 \leq l, m \leq i, j$) may be satisfied. However, $\beta_{ij} \leq \pm 3$ degrees also needs to be satisfied. Also, as shown in FIG. 7(a), in the striped structure 50, a pair of adjacent projections 50a may be connected together with at least one connecting portion 50c that does not run parallel to the direction in which the projections 50a run. In that case, the projections 50a as indicated by the dashed lines are suitably longer than the connecting portions 50c as indicated by the solid lines. Alternatively, as shown in FIG. 7(b), in the striped structure 50, each of the projections 50a may be divided by at least one groove 50d which does not run parallel to the projection 50a into the portions indicated by dashed lines. In that case, a slope that defines an angle $\beta \pm 3$ degrees (as indicated by the dashed lines) is suitably longer than a slope that defines an angle $\beta > 3$ degrees (as indicated by the solid lines).

Hereinafter, the relationship between the striped structure 50 and the polarization property of the light emitted from this semiconductor light-emitting element 101 and the relationship between the striped structure 50 and the light distribution characteristic changes will be explained.

As shown in FIG. 3, the polarized light produced in the active layer region 22 travels through the n-type nitride semiconductor layer 21 and the substrate 10 and then is incident on the second principal surface 10b that is a light-emitting face (such light will be referred to herein as "incident light"). A part of the incident light is transmitted through the constituent material of the striped structure 50 and travels outside of this light-emitting element 100. Meanwhile, another part of the incident light is reflected at the second principal surface 10b and then travels inside the constituent material of the striped structure 50 again. In the following description, the light that has gone out of this light-emitting element through the constituent material of the striped structure 50 will be referred to herein as "transmitted light" and the light that travels inside the constituent material of the striped structure 50 again will be referred to herein as "reflected light". Also, the ratio of the intensity of the transmitted light to that of the incident light will be referred to herein as "transmittance" and the ratio of the intensity of the reflected light to that of the incident light will be referred to herein as "reflectance". Furthermore, the angle formed between the propagation vector of the incident light and a vector representing a normal line to the light-emitting face (i.e., the second principal surface 10b) will be referred to herein as the "angle of incidence". The angle formed between the propagation vector of the transmitted light and a vector representing a normal line to the light-emitting face will be referred to herein as the "angle of refraction". And a plane defined by the propagation vector of the incident light and the vector representing a normal line to the light-emitting face will be referred to herein as an "incident plane". In this case, the propagation vector can also be regarded as representing the direction in which light travels. Furthermore, light is divided into two electric field vector components that are respectively parallel and perpendicular to the incident plane, which will be referred to herein as a "p-wave" and an "s-wave", respectively.

Figure 8:
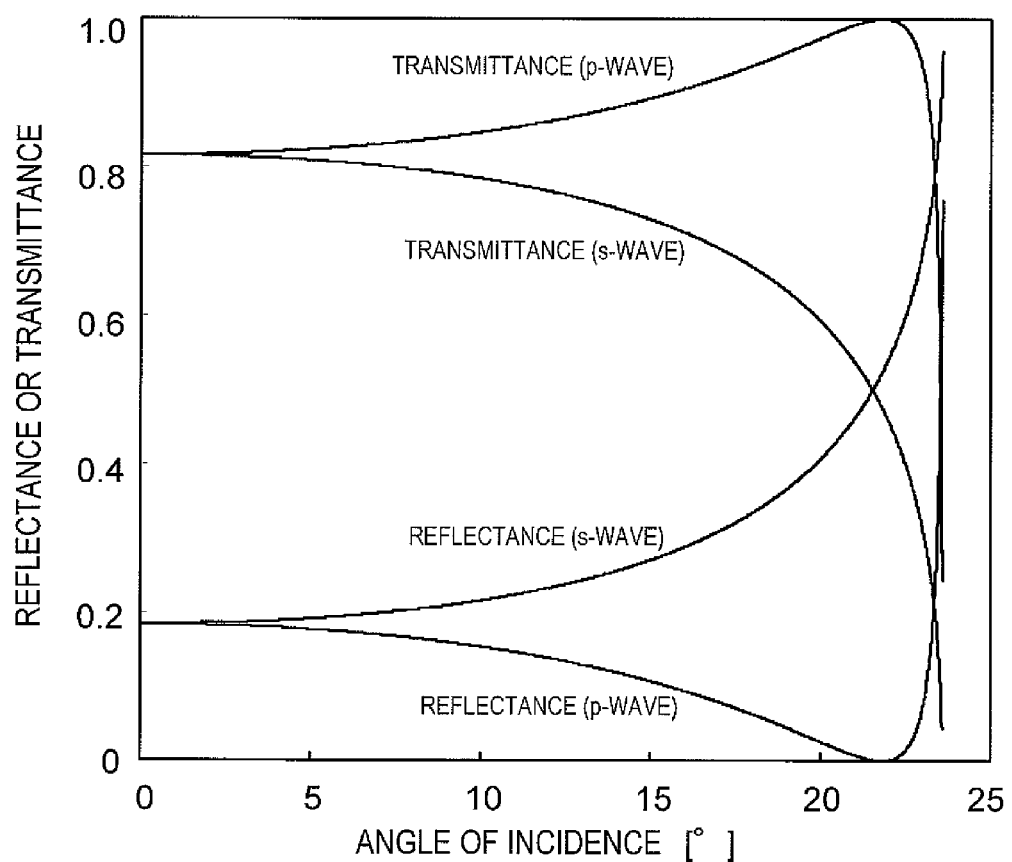
FIG. 8 shows relations between the angle of incidence, the reflectance and the transmittance.

Next, it will be considered on what condition the polarization property of the light that has been incident on a plane can be maintained in the transmitted light. FIG. 8 shows the relationship between the transmittance and reflectance with respect to the angle of incidence of the light that was incident on a plane. The results shown in FIG. 8 were separately calculated for the p-wave and s-wave components. The calculations were made based on Fresnel equations represented by the following Equations (2) to (5), where Rp denotes the reflectance of the p-wave, Rs denotes the reflectance of the s-wave, Tp denotes the transmittance of the p-wave, Ts denotes the transmittance of the s-wave, $\theta i$ denotes the angle of incidence, and $\theta t$ denotes the angle of refraction. The calculations were made with the refractive index n of the constituent material of the striped structure 50 supposed to be 2.5 and the refractive index outside of the constituent material of the striped structure 50 supposed to be 1.0.

As can be seen from FIG. 8, the p- and s-wave components of the incident light have mutually different transmittances and reflectances. This means that if the incident light is a composite wave of the p- and s-waves, the ratio of the scalar quantity of the electric field vector of the p-wave of the incident light to that of the electric field vector of the s-wave changes when the light is transmitted through a plane (i.e., the polarization direction of the transmitted light has changed from that of the incident light). For that reason, in general, the outgoing light cannot maintain the electric field vector direction of the incident light.

However, if either the p-wave component or the s-wave component of the incident light is equal to zero, such a zero wave component cannot be included in the transmitted light, and therefore, the ratio of the scalar quantities does not change and the electric field vector direction can be maintained. In other words, in order to maintain the polarization property, either the p-wave component or the s-wave component of every incident light needs to be zero.

$$R_p = \left\{ \frac{\tan(\theta_i - \theta_t)}{\tan(\theta_i + \theta_t)} \right\}^2 \quad (2)$$

$$R_p = \left\{ \frac{\sin(\theta_i - \theta_t)}{\sin(\theta_i + \theta_t)} \right\}^2 \quad (3)$$

$$T_p = \frac{n_t \cos\theta_t}{n_i \cos\theta_i} \left\{ \frac{2\sin\theta_t \cos\theta_t}{\sin(\theta_i + \theta_t)\cos(\theta_i - \theta_t)} \right\}^2 \quad (4)$$

$$T_p = \frac{n_t \cos\theta_t}{n_i \cos\theta_i} \left\{ \frac{2\sin\theta_t \cos\theta_t}{\sin(\theta_i + \theta_t)} \right\}^2 \quad (5)$$

The semiconductor light-emitting element 101 made of a nitride-based semiconductor that uses an m plane as its principal surface produces light polarized in the a-axis direction. Also, the polarized light has such light distribution characteristic that the angle of radiation is broader in the c-axis direction (i.e., an mc plane) than in the a-axis direction (i.e., an ma plane). That is why in the semiconductor light-emitting element of the present invention, (1) the polarized light produced in the active layer region 22 is made incident on the striped structure 50 so that the light incident on the slope 52 and upper surface 53 of the striped structure 50 is mainly made of s-wave components and includes almost zero p-wave components, and (2) the polarized light produced in the active layer region 22 is made incident on the striped structure 50 so that the polarized light satisfies this condition (1) and is incident on the slope 52 and upper surface 53 of the striped structure 50 in the c-axis direction (mc plane) with the broader angle of radiation. Thanks to these two features, the semiconductor light-emitting element of the present invention can increase the light extraction efficiency and improve the light distribution characteristic while maintaining the original polarization property.

Figure 9:
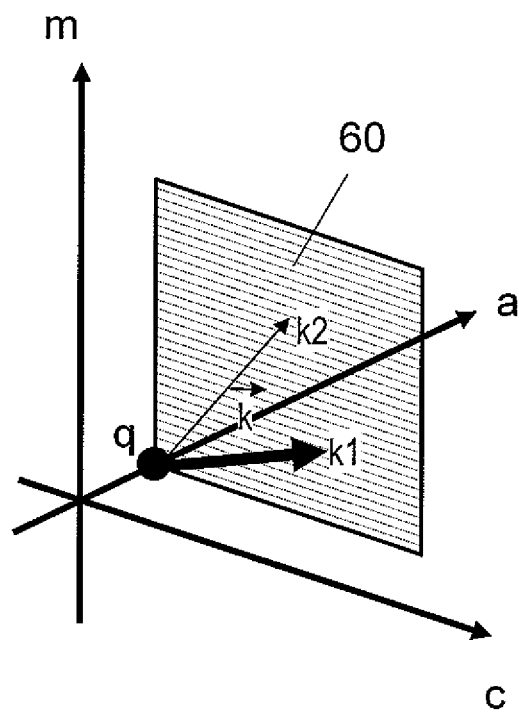
FIG. 9(a) schematically shows the propagation vector of light that is polarized in the a-axis direction, and (b) shows the light distribution characteristics in the a- and c-axis directions as viewed along the m-axis.
Figure 9:
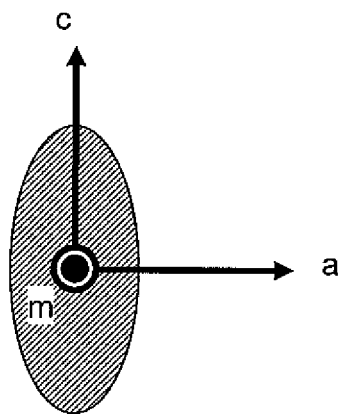

FIG. 9(a) schematically illustrates a range in which most of the propagation vector of the light polarized in the a-axis direction falls. This propagation vector is mostly made up of components that are perpendicular to the electric field vector. In this case, most of the propagation vectors k1, k2, and so on of the light polarized in the a-axis direction, which has been produced at the point q, are included within the shadowed plane 60 shown in FIG. 9(a), i.e., a plane which is parallel to the plane defined by the m- and c-axes (which will be referred to herein as an "mc plane"). FIG. 9(b) shows the light distribution characteristic of the polarized light that has been produced at the point q. If the point q is put at the origin of the acm coordinate system, the polarized light has such light distribution characteristic that the angle of radiation is wider in the c-axis direction (i.e., on the mc plane) rather than in the a-axis direction (i.e., on the ma plane) as described above.

Figure 10:
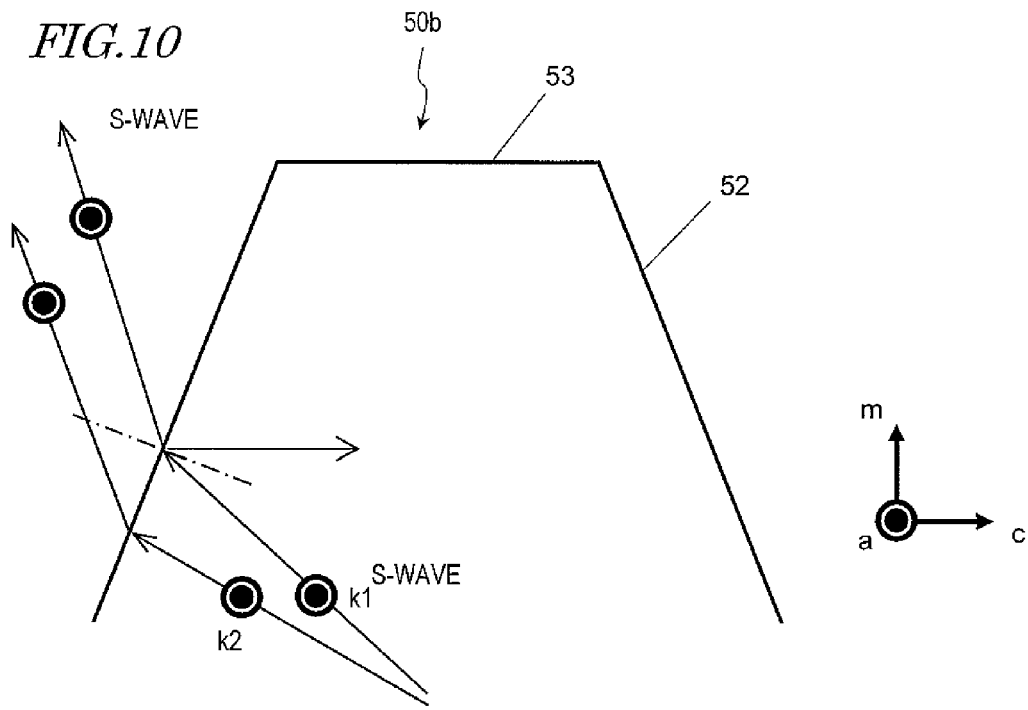
FIG. 10 schematically shows an example of polarized light that is incident on a projection of the striped structure in the first embodiment.

In the semiconductor light-emitting element 101, the striped structure 50 is arranged so that the direction in which the projections 50a run is parallel to the a-axis direction. In this case, the light incident on the slope 52 and upper surface 53 of the striped structure 50, in which the angle β is zero (i.e., the direction in which the projections 50a run is parallel to the a-axis), consists mostly of s-waves as shown in FIG. 10. The electric field intensity distribution of the polarized light is biased toward the a-axis direction and is very little in the direction that is perpendicular to the a-axis direction. Consequently, the p-wave component of the light incident on the slope 52 and the upper surface 53 is almost equal to zero. Thus, for the reasons described above, the polarization property of the transmitted light can be substantially maintained. Also, in this case, most of the polarized light radiated toward the mc plane at a broad angle of radiation is incident on the two slopes 52 and the upper surface 53 as s-wave light rays as shown in FIG. 10. Thus, almost all of the polarized light produced in the active layer region 22 satisfies the conditions described above and can be transmitted out of this light-emitting element while maintaining the original polarization property. Consequently, the semiconductor light-emitting element of the present invention can extract the polarized light highly efficiently while maintaining the polarization property.

Figure 11:
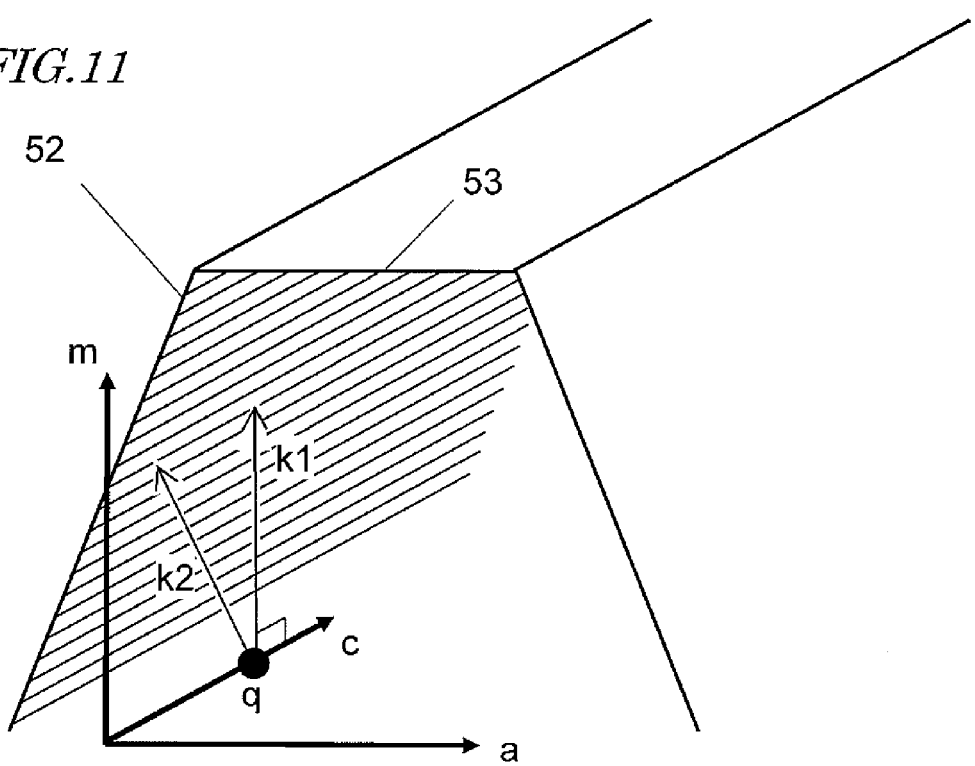
FIG. 11 schematically shows an example of polarized light that is incident on the light-emitting face of a striped structure, which is formed perpendicularly to the polarization direction.

On the other hand, the light-emitting elements disclosed in Patent Documents Nos. 3 and 4 should be unable to maintain the polarization property. Specifically, in the light-emitting elements disclosed in Patent Documents Nos. 3 and 4, the stripes run perpendicularly to the polarization direction of the polarized light (which would correspond to a situation where β=90 degrees). In that case, the propagation vectors of the light polarized in the a-axis direction, which has been produced at the point q, are present within the mc plane such as k1 and k2 as shown in FIG. 11. In such a situation, if the angle defined by the propagation vector k1 with respect to the c-axis is 90 degrees, then the incident plane of the propagation vector k1 becomes parallel to the ma plane. Since the electric field vector direction is the a-axis direction, the polarized light k1 defined by the propagation vector k1 is incident as a p-wave on the slope 52 of the striped structure 50. Meanwhile, there is no s-wave component there. Consequently, the electric field vector direction of the polarized light k1 is maintained.

However, in most of the light polarized in the a-axis direction, which has been produced at the point q, the angle defined by the propagation vector with respect to the c-axis becomes different from 90 degrees as in the propagation vector k2. The incident plane of the propagation vector k2 is not parallel to the ma plane. In that case, the polarized light k2 with the propagation vector k2 is incident as a composite wave of s- and p-waves on the slope 52 of the striped structure 50. That is why when the polarized light k2 is transmitted through the slope 52 to leave this light-emitting element, the ratio of the scalar quantities of the p- and s-waves changes and the electric field vector direction changes, too. As a result, every light polarized in the a-axis direction, which has been produced at the point q, has its electric field vector direction disturbed at the slope 52 except the polarized light k1. Consequently, if β=90 degrees, the degree of polarization decreases too much to maintain the polarization property. In this description, the "degree polarization" is a value calculated by the following Equation (6):

$$\text{(degree of polarization)} = (I_{max} - I_{min})/(I_{max} + I_{min}) \tag{6}$$

$I_{max}$ and $I_{min}$ are values to be obtained when measurement is carried out in the following manner. Specifically, a polarizer is arranged parallel to the light-emitting face and the intensity of the light that has been transmitted through the polarizer is measured with the polarizer rotated. The intensity of the light measured becomes a maximum value at a certain angle and becomes a minimum value at another angle. The maximum and minimum values in such a situation are identified herein by $I_{max}$ and $I_{min}$, respectively. If the intensity of the light remains the same at every angle, then $I_{max}$ and $I_{min}$ are equal to each other and the degree of polarization becomes zero.

Figure 12:
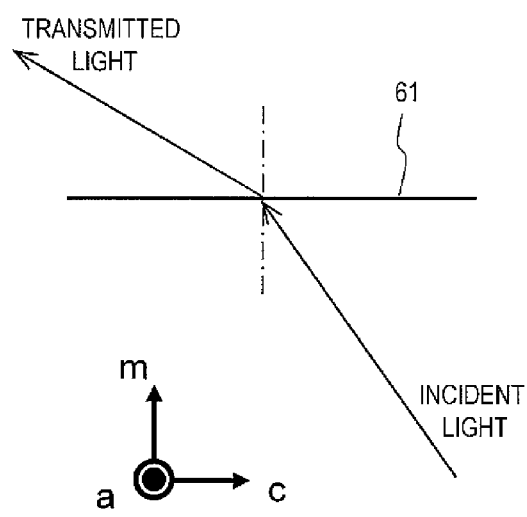
FIGS. 12(a) and (b) schematically show examples of light incident on, and transmitted through, the light-emitting face of a semiconductor light-emitting element having a flat light-emitting face as viewed in the a- and c-axis directions, respectively, and (c) schematically shows exemplary light incident on, and transmitted through, the light-emitting face of a nitride-based semiconductor light-emitting element according to the first embodiment.
Figure 12:
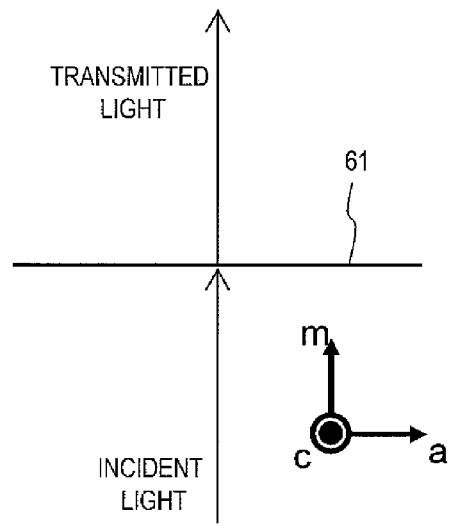
Figure 12:
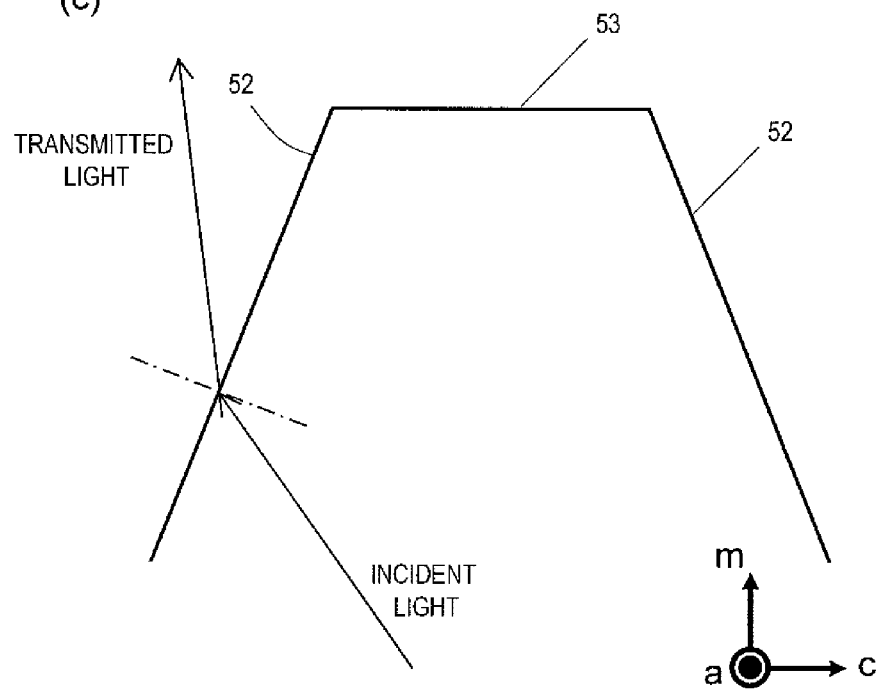

By making polarized light incident on the striped structure 50 with such relations satisfied, the semiconductor light-emitting element of the present invention can also make improvement on the degree asymmetry of the light distribution characteristic. FIGS. 12(a) and 12(b) show to what direction a light ray gets refracted in a situation where light is emitted from a semiconductor light-emitting element with no light extraction structure and having a light-emitting face 61 that is parallel to an m plane.

FIG. 12(a) shows how the light ray is refracted when viewed in the a-axis direction. The light that has been incident on the light-emitting face 61 gets refracted toward the light-emitting face 61 and goes out of this light-emitting element. As a result, the propagation vector of the transmitted light goes closer to the c-axis direction. Also, the propagation vector of the light polarized in the a-axis direction has little a-axis direction components. That is why when viewed in the c-axis direction as shown in FIG. 12(b), the principal incident light is incident substantially perpendicularly onto the light-emitting face and gets transmitted through the facet almost without getting refracted. This means that the polarized light produced in the active layer region originally has such a light distribution characteristic that the angle of radiation becomes wider in the c-axis direction rather than in the a-axis direction but that as the polarized light goes out of this light-emitting element through the light-emitting face 61 that is parallel to an m plane, the angle of radiation in the c-axis direction becomes even wider.

Consequently, the propagation vector of the light emitted from the active layer region 22 of the semiconductor light-emitting element 101 satisfies the relation (a-axis component)<(c-axis component). This also means that the relation (intensity of light emitted in a-axis direction)<(intensity of light emitted in c-axis direction) is also satisfied. That is to say, this light distribution characteristic is an asymmetric one.

On the other hand, in the semiconductor light-emitting element 101 of this embodiment, the light incident on the slope 52 of the striped structure 50 is transmitted toward the light-emitting face as shown in FIG. 12(c). As a result, the propagation vector of the transmitted light points toward the m-axis. That is to say, the incident light is refracted so that the angle of radiation becomes narrower in the c-axis direction. Consequently, the polarized light extracted from this semiconductor light-emitting element 101 has less propagation vectors with the c-axis direction components than the light extracted from the semiconductor light-emitting element having a flat light-emitting face 61. Consequently, the respective quantities of the propagation vectors with the a-axis direction components and propagation vectors with the c-axis direction components become closer to each other and the degree of asymmetry of the light distribution characteristic can be improved.

As can be seen, in the semiconductor light-emitting element of the present invention, the light-emitting face, through which the light produced in the active layer region is extracted, has a striped structure that runs parallel to the a-axis, and therefore, light polarized in the a-axis direction can be incident as light consisting mostly of s-wave components on the slope and upper surface of projections that form the striped structure. As a result, the polarized light can be extracted out of this light-emitting element more efficiently while maintaining the polarization property. In addition, since most of the polarized light produced is light polarized in the a-axis direction and incident on the slope and upper surface of the projections with the condition described above satisfied, the light can be emitted out of this light-emitting element with the polarization property maintained at a high percentage. Moreover, since the light polarized in the a-axis direction is refracted at the boundary between the slope of the projections and outside so as to go toward the m-axis, the degree of asymmetry of the light distribution characteristic can be improved as well.

According to the present invention, a striped structure is provided for the light-emitting face of a semiconductor light-emitting element in order to make the light incident on the striped structure as much as possible with the condition for maintaining the polarization property satisfied, instead of keeping high transmittance or low reflectance. In this respect, it can be said that the light-emitting element of Patent Document No. 3, which makes light incident on the light-emitting face at a Brewster angle at which the reflectance becomes zero, is based on a totally different idea from the present invention. Also, according to Patent Document No. 3, in order to take advantage of the zero-reflectance feature, the polarized light incident on the striped structure needs to be made up of p-wave components. For that reason, it is meaningless for the light-emitting element of Patent Document No. 3 to use polarized light as light made up of s-wave components.

Meanwhile, Japanese Laid-Open Patent Publication No. 2001-201746 discloses a technique for transforming non-polarized light that has been incident on a light guide member into polarized light and outputting the polarized light by forming a plurality of ribs, each having a predetermined height, on the light guide member for use as a backlight for a liquid crystal display element. This technique, however, just uses the fact that the P- and S-wave components of light incident on a plane have different reflectances and different transmittances as shown in FIG. 8, which is quite different from the object, structure and principle of increasing the extraction efficiency of the semiconductor light-emitting element of the present invention described above.

Figure 13:
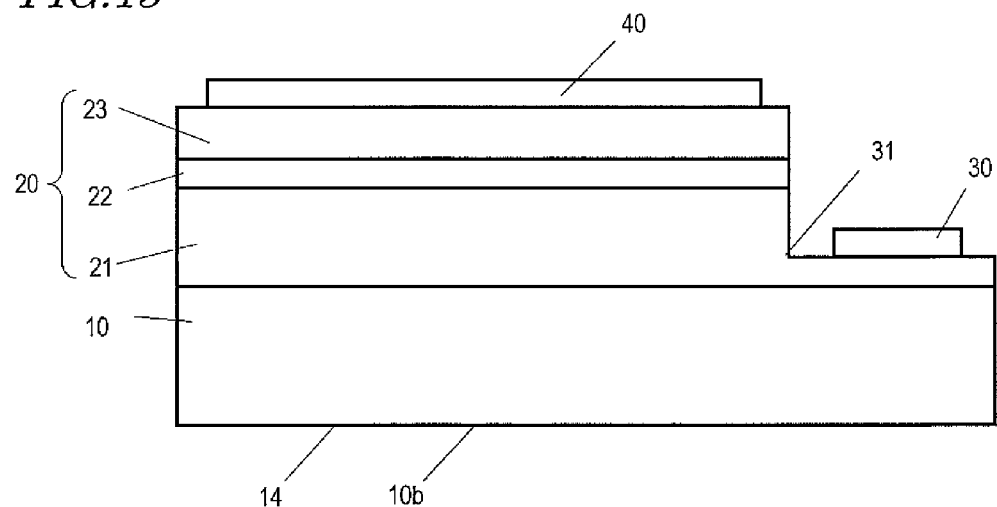
FIG. 13 is a schematic cross-sectional view illustrating a structure obtained during a manufacturing process of the first embodiment.

Hereinafter, an exemplary method for fabricating the semiconductor light-emitting element 101 will be described. As shown in FIG. 13, first of all, a semiconductor multilayer structure 20 is formed. The semiconductor multilayer structure 20 may be formed by an MOCVD (metalorganic chemical vapor deposition) process on a substrate 10 of n-type GaN, for example.

Specifically, an n-type nitride semiconductor layer 21 is grown epitaxially on a substrate 10 made of n-type GaN, of which the principal surface is an m plane. For example, using silicon as an n-type dopant and $Ga(CH_3)_3$ (trimethylgallium (TMG)) and $NH_3$ as source gases, respectively, an n-type nitride semiconductor layer 21 of GaN is deposited to a thickness of about 3 μm at a growing temperature of approximately 900 degrees Celsius to 1100 degrees Celsius.

Next, an active layer region 22 is formed on the re-type nitride semiconductor layer 21. The active layer region 22 may have a GaInN/GaN multiple quantum well (MQW) structure in which $Ga_{1-x}In_xN$ well layers, each having a thickness of approximately 9 nm, and GaN barrier layers, each having thickness of approximately 9 nm, are stacked alternately. In forming the $Ga_{1-x}In_xN$ well layers, the growing temperature is suitably decreased 800 degrees Celsius in order to introduce In. The emission wavelength is selected according to the intended use of the semiconductor light-emitting element 101 and the In mole fraction x is determined by the wavelength. Specifically, if the wavelength is set to be 450 nm (blue), the In mole fraction x is set to fall within the range of 0.18 through 0.2. On the other hand, if the wavelength is 520 nm (green), then x=0.29 to 0.31. And if the wavelength is 630 nm (red), then x=0.43 to 0.44. By controlling the In mole fraction in this manner, a semiconductor light-emitting element 101 which can emit blue, green and red rays and which can be used as an illumination unit is obtained.

Optionally, an undoped GaN layer (not shown) may be deposited to a thickness of about 30 nm on the active layer region 22. Next, a p-type nitride semiconductor layer 23 is formed on the undoped GaN layer. For example, using $Cp_2Mg$ (cyclopentadienyl magnesium) as a p-type dopant and TMG, $Al(CH_3)_3$ (trimethylaluminum (TMA)) and $NH_3$ as source gases, respectively, a p-type nitride semiconductor layer 23 of $p-Al_xGa_{1-x}N$ is deposited to a thickness of about 70 nm at a growing temperature of approximately 900 degrees Celsius to 1100 degrees Celsius. The mole fraction x may be set to be approximately 0.14, for example.

Next, using $Cp_2Mg$ as a dopant, a p-GaN contact layer (not shown) is deposited to a thickness of approximately 0.5 μm, for example, on the p-type nitride semiconductor layer 23. After that, the entire substrate is thermally treated at a temperature of approximately 800 degrees Celsius to 900 degrees Celsius.

Subsequently, a p-type electrode 40 and an n-type electrode 30 are formed. By performing a dry etching process using a chlorine based gas, the p-GaN contact layer, the p-type nitride semiconductor layer 23, the undoped GaN layer, the active layer region 22 and the n-type nitride semiconductor layer 21 are partially removed to make a recess 31 and expose a part of the n-type nitride semiconductor layer 21.

Next, on that part of the n-type nitride semiconductor layer 21, which is exposed at the bottom of the recess 31, a stack of Ti/Pt layers is formed as the n-type electrode 30. Meanwhile, a stack of Pd/Pt layers is formed as the p-type electrode 40 on the p-GaN contact layer. After that, a heat treatment process is carried out to alloy the Ti/Pt layers with the n-type nitride semiconductor layer 21 and the Pd/Pt layers with the p-GaN contact layer and form an n-type electrode 30 and a p-type electrode 40 on the n-type nitride semiconductor layer 21 and on the p-GaN contact layer, respectively.

Figure 14:
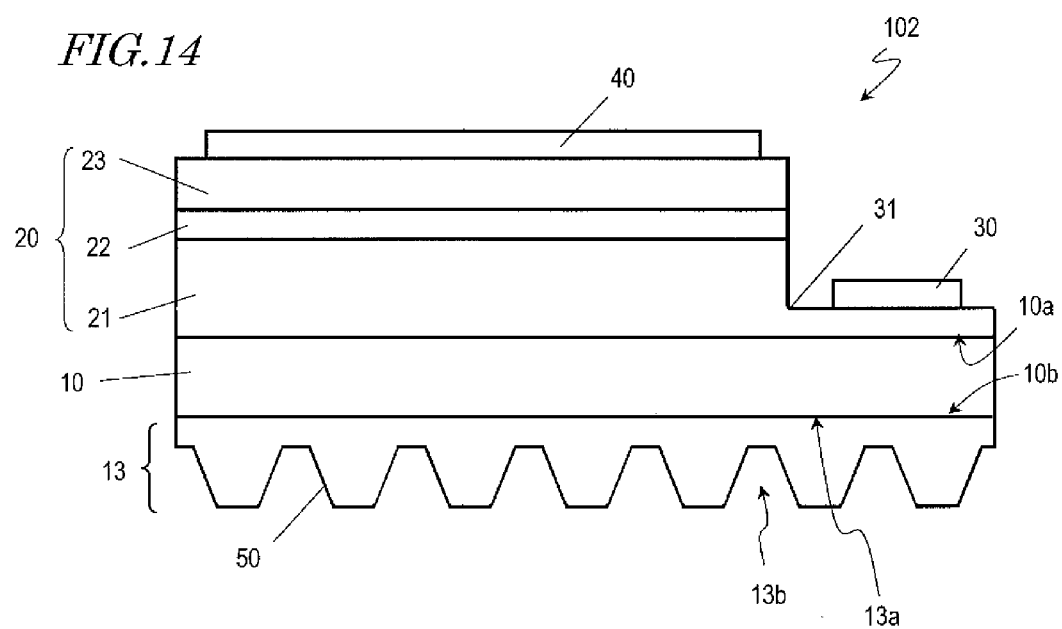
FIG. 14 is a schematic cross-sectional view illustrating a second embodiment of a semiconductor light-emitting element according to the present invention.

Thereafter, the second principal surface 10b of the substrate 10 is polished to reduce the thickness of the semiconductor light-emitting element 101 and decrease absorption of light into the semiconductor light-emitting element 101. The semiconductor light-emitting element 101 may have a thickness of 100 μm, for example, because the semiconductor light-emitting element 101 can be handled easily when mounting on a circuit board. In this manner, the structure of the semiconductor light-emitting element 101 with a flat light-emitting face 14 as shown in FIG. 14 is completed.

Next, a striped structure 50 is formed on the flat light-emitting face 14. The striped structure 50 may be formed by any of various methods including a technique that uses a contact exposure system, a technique that uses an electron beam lithography system, a technique that uses nano imprint, and a technique that uses a stepper. In this embodiment, a method for forming the striped structure 50 using a contact exposure system and an electron beam lithography system will be described in detail. In the following description, the second principal surface 10b, which is the light-emitting face on which the striped structure 50 has not been formed yet, will be referred to herein as a "flat light-emitting face 14".

First of all, an $SiO_2$ film is deposited as a hard mask material on the flat light-emitting face 14. The $SiO_2$ film may be deposited by plasma chemical vapor deposition (p-CVD) process, for example. Next, a photoresist is applied onto the hard mask. After the photoresist has been applied, an exposure process is carried out using a contact exposure system or an electron beam lithography system and then a development process is performed to define a resist pattern including a number of stripes that run parallel to the a-axis.

Thereafter, using the resist pattern as a mask, the hard mask is dry-etched using $CF_4$ gas and $O_2$ gas, for example. Next, using the hard mask as a mask, the flat light-emitting face 14 is dry-etched using a chlorine based gas, for example. Finally, the hard mask is removed by dry etching. In this manner, a semiconductor light-emitting element 101, including the striped structure 50 on the second principal surface 101 of the substrate 10 as shown in FIG. 3, is completed.

The striped structure 50 may also be formed on the flat light-emitting face 14 in the following manner. First, a photoresist is applied onto the flat light-emitting face 14, an exposure process is performed using a contact exposure system, and then a development process is carried out to define a resist pattern including a number of stripes that run in a direction which defines 0 degrees≤|β|≤5 degrees (more suitably, 0 degrees≤|β|≤3 degrees) with respect to the a-axis. By heating the photoresist, dry etch resistance is increased. Thereafter, by using the photoresist as a mask, the flat light-emitting face 14 is dry etched using a chlorine based gas. As a result, the photoresist is also removed at the same time. In this manner, a semiconductor light-emitting element 101, including the striped structure 50 on the second principal surface 10b of the substrate 10, is completed.

The semiconductor multilayer structure 20 does not have to be formed on an n-type GaN substrate, of which the principal surface is an m plane, but may also be an m plane GaN layer which has been formed, by crystal growing process, on an SiC substrate, a sapphire substrate, an $LiAlO_2$ substrate, a $Ga_2O_3$ substrate, an SiC substrate, or an Si substrate. In that case, before a nitride-based semiconductor is grown epitaxially on any of these substrates, the striped structure 50 may be formed in advance. And after the semiconductor has been grown epitaxially, the substrate is removed by laser lift off process, for example. In this case, the striped structure 50 that has been formed before the semiconductor is epitaxially grown is transferred onto the nitride-based semiconductor. That is why a semiconductor light-emitting element 101 with the striped structure 50 can be eventually obtained by removing the substrate. The semiconductor light-emitting element 101 may be completed in this manner, too. To grow an m plane nitride-based semiconductor epitaxially on a substrate, the plane orientation of the SiC or sapphire substrate is suitably an m plane, too. However, it was reported that a-plane GaN could grow on an r-plane sapphire substrate. That is why to grow a semiconductor layer, of which the principal surface is an m plane, the principal surface of the substrate 10 does not have to be an m plane but the active layer region 22 needs to be parallel to an m plane and its crystal growing direction needs to be perpendicular to the m plane, to say the least.

Embodiment 2

FIG. 14 schematically illustrates a cross-sectional structure of a semiconductor light-emitting element as a second embodiment of the present invention. As shown in FIG. 14, the semiconductor light-emitting element 102 includes a substrate 10, a semiconductor multilayer structure 20 which has been formed on the first principal surface 10a of the substrate 10 and which includes an active layer region 22, and a light output member 13 which is arranged on the second principal surface 10b of the substrate 10. The semiconductor multilayer structure 20 further includes an n-type electrode 30 and a p-type electrode 40. The semiconductor multilayer structure 20, the n-type electrode 30 and the p-type electrode 40 have the same structures as the first embodiment described above.

The light output member 13 is arranged in contact with the second principal surface 10b of the substrate 10, which is opposite from the other surface with the semiconductor multilayer structure 20. The first principal surface 13a of the light output member 13 is in contact with the substrate 10 and the second principal surface 13b thereof has the striped structure 50. The light output member 13 is made of a material other than a GaN semiconductor such as $SiO_2$, SiN, SiC, $TiO_2$, sapphire, $LiAlO_2$, or $Ga_2O_3$ which transmits the polarized light produced in the active layer region 22. More suitably, the light output member 13 is made of a material which can be easily patterned by dry etching, for example.

Generally speaking, a dry etching process to be performed on a nitride-based semiconductor such as the substrate 10 made of n-type GaN has some problems such as a low etch rate and difficulty to control the sidewall shape. However, by providing a light output member 13 made of such a material, the striped structure 50 can be formed more easily. Also, if $SiO_2$ or SiN is used as a material for the light output member 13, the striped structure 50 can be formed by performing a wet etching process using an aqueous solution including hydrofluoric acid.

Also, the refractive index $n_o$ of the light output member 13 is suitably equal to or greater than the refractive index $n_t$ of an external medium with which the second principal surface 13b with the striped structure 50 contacts (i.e., $n_t < n_o$). Thus, compared to a situation where the polarized light is transmitted through the substrate 10 and extracted directly, the transmittance of the light through the second principal surface 10b of the substrate 10 can be increased, and eventually, the light extraction efficiency can be further increased.

This semiconductor light-emitting element 102 may be fabricated in the following manner, for example.

First of all, as shown in FIG. 13, a semiconductor multilayer structure 20 is formed on the substrate 10 by the same method as the one adopted in the first embodiment. As the substrate 10, an n-type GaN substrate, an SiC substrate, a sapphire substrate, an LiAlO$_2$ substrate, or a Ga$_2$O$_3$ substrate may be used as long as their principal surface is an m plane. An n-type electrode 30 and a p-type electrode 40 are also formed.

Thereafter, a light output member 13 is formed on the second principal surface 10b of the substrate 10. If the light output member 13 needs to be made of SiO$_2$, an SiO$_2$ film is formed by plasma chemical vapor deposition process, for example. In this case, the thicker the SiO$_2$ film, the lower its film quality and its transmittance will be. For that reason, the light output member 13 suitably has a thickness of 10 μm or less.

After that, a resist pattern is defined on the SiO$_2$ film and the SiO$_2$ film is selectively etched using the resist pattern as already described for the first embodiment. For example, by dry-etching the SiO$_2$ film using a mixture of CF$_4$ and O$_2$ gases, the striped structure 50 can be formed more easily and with more controllability than in a situation where the substrate 10 made of a nitride semiconductor is etched. In this manner, the semiconductor light-emitting element 102 shown in FIG. 14 is completed.

Embodiment 3

Figure 15:
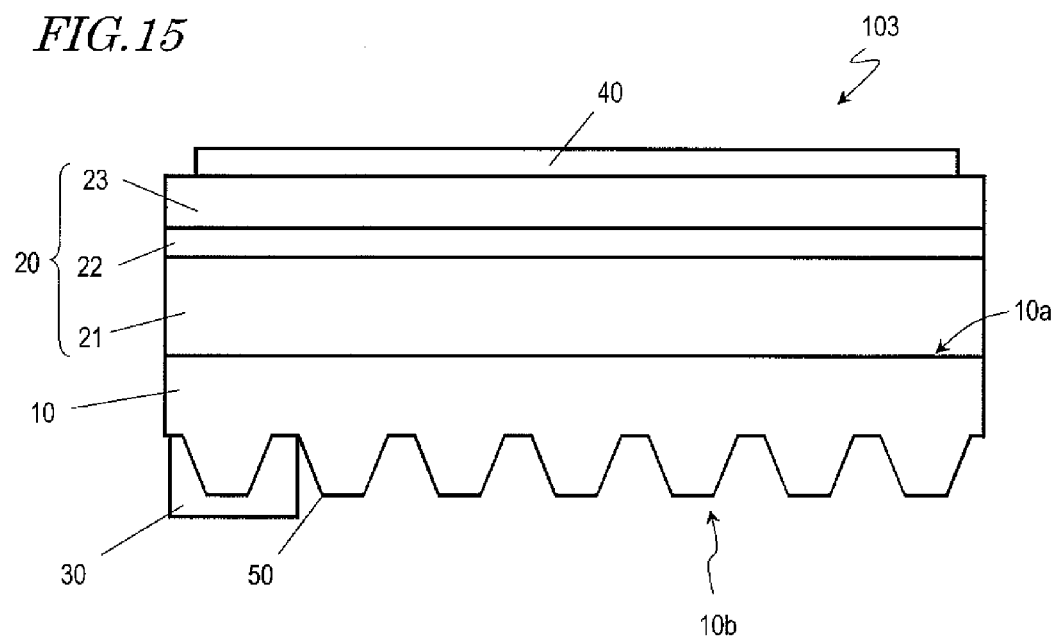
FIG. 15 is a schematic cross-sectional view illustrating a third embodiment of a semiconductor light-emitting element according to the present invention.

FIG. 15 schematically illustrates a cross-sectional structure of a semiconductor light-emitting element as a third embodiment of the present invention. As shown in FIG. 15, the semiconductor light-emitting element 103 includes a substrate 10, a semiconductor multilayer structure 20 which has been formed on the first principal surface 10a of the substrate 10 and which includes an active layer region 22, an n-type electrode 30 and a p-type electrode 40.

In this semiconductor light-emitting element 103, the semiconductor multilayer structure 20 has no recess 31 and the n-type electrode 30 is arranged on the second principal surface 10b of the substrate 10 with the striped structure 50, which is a major difference from the first embodiment described above. The semiconductor multilayer structure 20, the p-type electrode 40 and the striped structure 50 are the same as the first embodiment.

As shown in FIG. 15, the n-type electrode 30 is a stack of Ti and Pt layers (Ti/Pt) and is arranged so as to partially cover the striped structure 50. As there is no need to make any recess 31 in the semiconductor multilayer structure 20 in this semiconductor light-emitting element 103, its element structure can be simplified and the manufacturing cost can be cut down.

This semiconductor light-emitting element 103 may be fabricated in the following manner. First of all, as already described for the first embodiment, a semiconductor multilayer structure 20 is formed on the first principal surface 10a of the substrate 10. Thereafter, the substrate 10 is polished until the overall thickness thereof becomes approximately 100 μm. Next, a striped structure 50 is formed on the second principal surface 10b of the substrate 10 as already described for the first embodiment.

After the striped structure 50 has been formed, electrodes are formed. First of all, a stack of Ti/Pt layers, for example, is formed as an n-type electrode 30 on a part of the second principal surface 10b with the striped structure 50. Meanwhile, a stack of Pd/Pt layers, for example, is formed as a p-type electrode 40 on the p-type nitride semiconductor layer 23. After that, a heat treatment process is carried out to alloy the Ti/Pt layers with the substrate 10 and the Pd/Pt layers with the p-GaN contact layer and form an n-type electrode 30 and a p-type electrode 40 which are electrically connected to the substrate 10 and the p-GaN contact layer, respectively. In this manner, the semiconductor light-emitting element 103 shown in FIG. 15 is completed.

Embodiment 4

Figure 16:
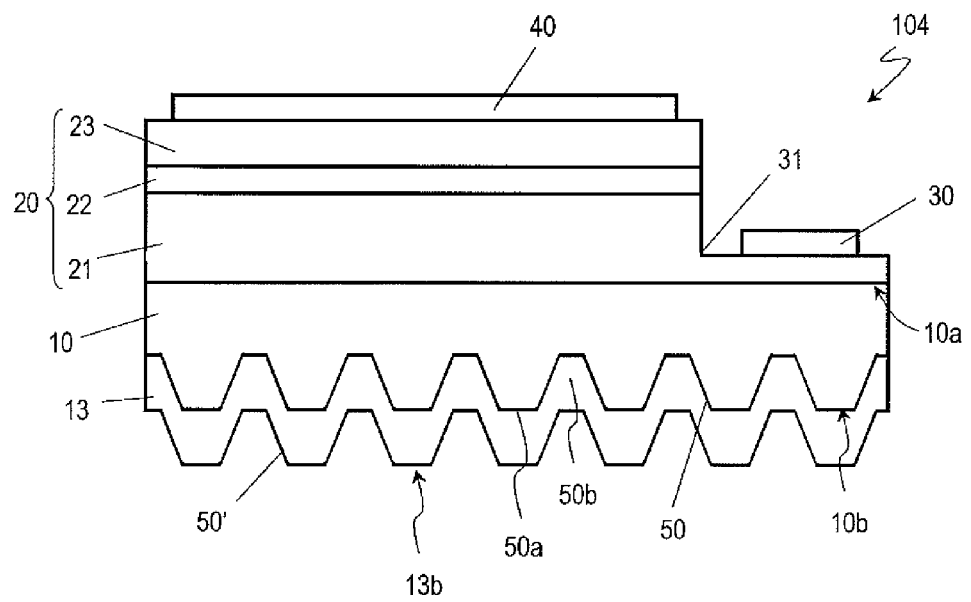
FIG. 16 is a schematic cross-sectional view illustrating a fourth embodiment of a semiconductor light-emitting element according to the present invention.

FIG. 16 schematically illustrates a cross-sectional structure of a semiconductor light-emitting element as a fourth embodiment of the present invention. As shown in FIG. 16, the semiconductor light-emitting element 104 includes a substrate 10, a semiconductor multilayer structure 20 which has been formed on the first principal surface 10a of the substrate 10 and which includes an active layer region 22, and a light output member 13, an n-type electrode 30 and a p-type electrode 40.

In this semiconductor light-emitting element 104, the light output member 13 is arranged to cover the striped structure 50 on the second principal surface 10b of the substrate 10, which is a major difference from the first embodiment, and the substrate 10 has the striped structure 50, which is a major difference from the second embodiment. The semiconductor multilayer structure 20, the n-type electrode 30, the p-type electrode 40 and the striped structure 50 have the same structures as the first embodiment described above.

The refractive index $n_o$ of the light output member 13 that covers the striped structure 50 on the second principal surface 10a of the substrate 10 is suitably greater than the refractive index $n_t$ of a medium outside of this semiconductor light-emitting element 104 (i.e., $n_t < n_o$). Also, the light output member 13 suitably has high transmittance with respect to the polarized light produced in the active layer region 22. Thus, compared to a situation where the polarized light is transmitted through the substrate 10 and extracted directly, the transmittance of the light through the second principal surface 10b of the substrate 10 can be increased, and eventually, the light extraction efficiency can be further increased. The light output member 13 is made of a material other than a GaN semiconductor such as SiO$_2$, SiN, SiC, TiO$_2$, sapphire, LiAlO$_2$, or Ga$_2$O$_3$ which transmits the polarized light produced in the active layer region 22.

The light output member 13 may either completely fill the grooves 50b of the striped structure 50 to make the second principal surface 13b, which contacts with the external medium, totally flat or have a striped structure 50' corresponding to the striped structure 50 of the second principal surface 13b. The refractive index $n_o$ of the light output member 13 suitably satisfies $n_t < n_o < n_l$, where $n_l$ is the refractive index of the substrate 10. By changing the refractive index stepwise from $n_l$ through $n_t$ in this manner, the transmittance to the polarized light produced in the active layer region 22 can be further increased.

The semiconductor light-emitting element 104 may be fabricated in the following manner, for example. First of all, the semiconductor multilayer structure 20, the n-type electrode 30 and the p-type electrode 40 are formed on the substrate 10 as already described for the first embodiment. Meanwhile, the striped structure 50 is formed on the second principal surface 10b of the substrate 10.

After that, the output member 13 is deposited. If an SiO$_2$ film is deposited as the output member 13, a plasma chemical vapor deposition process may be used. Thereafter, if necessary, the striped structure 50' is formed on the light output member 13 by the method that has already been described for the second embodiment.

Embodiment 5

Figure 17:
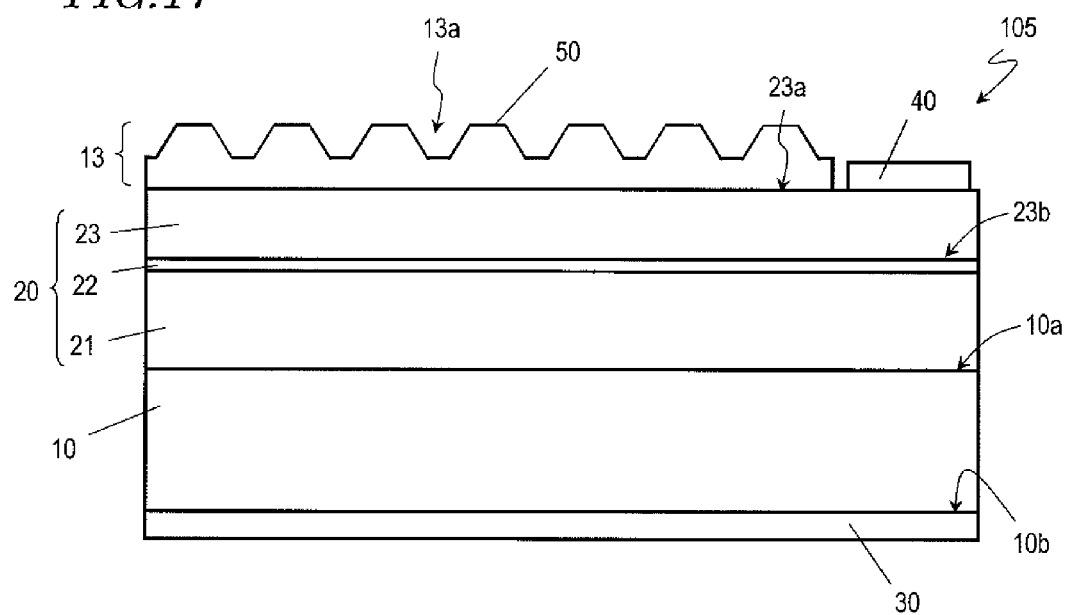
FIG. 17 is a schematic cross-sectional view illustrating a fifth embodiment of a semiconductor light-emitting element according to the present invention.

FIG. 17 schematically illustrates a cross-sectional structure of a semiconductor light-emitting element as a fifth embodiment of the present invention. As shown in FIG. 17, the semiconductor light-emitting element 105 includes a substrate 10, a semiconductor multilayer structure 20 which has been formed on the first principal surface 10*a* of the substrate 10 and which includes an active layer region 22, and a light output member 13, an n-type electrode 30 and a p-type electrode 40.

In this semiconductor light-emitting element 105, the light output member 13 is arranged on the p-type nitride semiconductor layer 23 and the polarized light produced in the active layer region 22 is transmitted through the p-type nitride semiconductor layer 23 and extracted through the light output member 13, which is a major difference from the first embodiment described above.

As shown in FIG. 17, the second principal surface 23*b* of the p-type nitride semiconductor layer 23 is closer to the active layer region 23, and the light output member 13 is arranged on the first principal surface 23*a* of the p-type nitride semiconductor layer 23. The first principal surface 13*a* of the light output member 13, which does not contact with the p-type nitride semiconductor layer 23, is a light-emitting face, and the striped structure 50 has been formed on a part of the first principal surface 13*a*. The p-type electrode 40 is arranged on another part of the first principal surface 23*a* of the p-type nitride semiconductor layer 23.

The n-type electrode 30 is arranged on, and electrically connected to, the second principal surface 10*b* of the substrate 10. The semiconductor multilayer structure 20 and the striped structure 50 have the same structures as the first embodiment described above.

The light output member 13 is made of a material other than a GaN semiconductor such as $SiO_2$, SiN, SiC, $TiO_2$, sapphire, $LiAlO_2$, or $Ga_2O_3$ which transmits the polarized light produced in the active layer region 22. More suitably, the light output member 13 is made of a material which can be easily patterned by dry etching, for example. Also, the refractive index $n_o$ of the light output member 13 is suitably equal to or greater than the refractive index $n_r$ of an external medium with which the first principal surface 13*a* with the striped structure 50 contacts (i.e., $n_r < n_o$). Thus, compared to a situation where the polarized light is transmitted through the p-type nitride semiconductor layer 23 and extracted directly, the transmittance of the light through the first principal surface 23*a* of the p-type nitride semiconductor layer 23 can be increased.

On top of that, compared to the second embodiment, the interval between the light output member 13 and the active layer region 22 can be shortened and absorption of the polarized light produced in the active layer region 22 into the semiconductor layer can be reduced. As a result, the light extraction efficiency can be further increased. Furthermore, as already described for the second embodiment, the striped structure 50 can also be formed easily.

This semiconductor light-emitting element 105 may be fabricated in the following manner. First of all, as already described for the first embodiment, a semiconductor multilayer structure 20 is formed on the substrate 10 as shown in FIG. 17. Thereafter, the substrate 10 is polished until the overall thickness thereof becomes approximately 100 µm.

Next, electrodes are formed. First of all, a stack of Ti/Pt layers, for example, is formed as an n-type electrode 30 on the second principal surface 10*b* of the substrate 10. Meanwhile, a stack of Pd/Pt layers, for example, is formed as a p-type electrode 40 on a part of the p-type nitride semiconductor layer 23. After that, a heat treatment process is carried out to alloy the Ti/Pt layers with the substrate 10 and the Pd/Pt layers with the p-GaN contact layer and form an n-type electrode 30 and a p-type electrode 40 which are coupled to the substrate 10 and the p-GaN contact layer, respectively.

After the electrodes have been formed, a light output member 13 is formed on the first principal surface 23*a* of the p-type nitride semiconductor layer 23. If the light output member 13 needs to be made of $SiO_2$, an $SiO_2$ film is deposited by plasma chemical vapor deposition process, for example. In this case, the thicker the $SiO_2$ film, the lower its film quality and its transmittance will be. For that reason, the light output member 13 suitably has a thickness of 10 µm or less.

Thereafter, a resist pattern is defined on the $SiO_2$ film and the $SiO_2$ film is selectively etched using the resist pattern as already described for the first embodiment. For example, by dry-etching the $SiO_2$ film using a mixture of $CF_4$ and $O_2$ gases, the striped structure 50 can be formed easily and with good controllability.

Finally, a resist pattern is defined on the striped structure 50 and the $SiO_2$ film is selectively etched using the resist pattern (e.g., wet-etched with hydrofluoric acid) to expose the p-type electrode 40. In this manner, the semiconductor light-emitting element 105 shown in FIG. 17 is completed.

Embodiment 6

Figure 18:
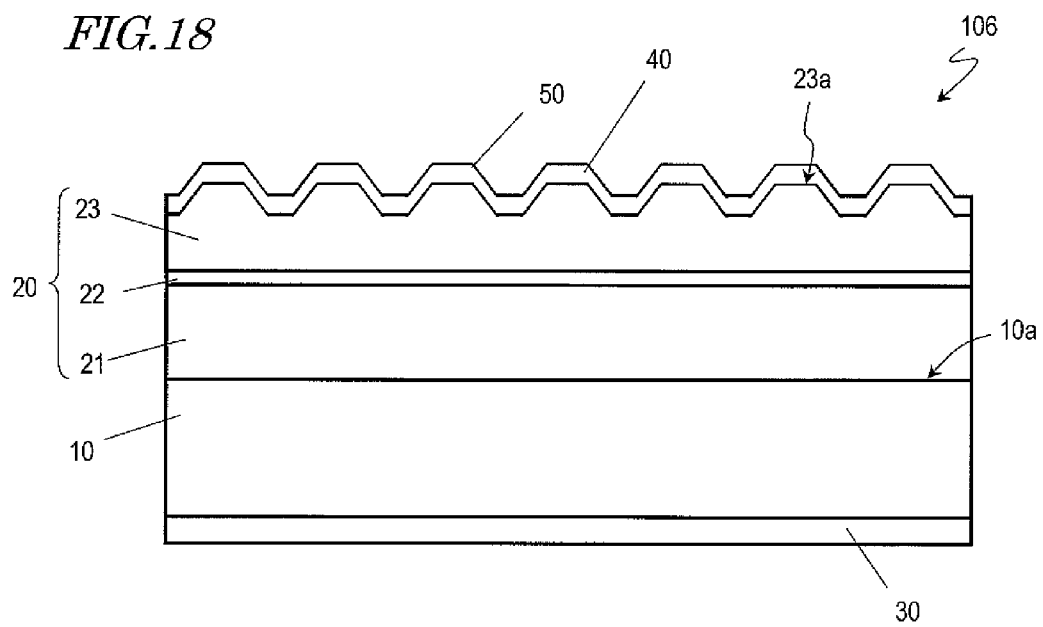
FIG. 18 is a schematic cross-sectional view illustrating a sixth embodiment of a semiconductor light-emitting element according to the present invention.

FIG. 18 schematically illustrates a cross-sectional structure of a semiconductor light-emitting element as a sixth embodiment of the present invention. As shown in FIG. 18, the semiconductor light-emitting element 106 includes a substrate 10, a semiconductor multilayer structure 20 which has been formed on the first principal surface 10*a* of the substrate 10 and which includes an active layer region 22, an n-type electrode 30 and a p-type electrode 40.

In this semiconductor light-emitting element 106, the striped structure 50 has been formed on the first principal surface 23*a* of the p-type nitride semiconductor layer 23 and the p-type electrode 40 has been formed over the entire surface of the striped structure 50, which are major differences from the fifth embodiment.

The p-type electrode 40 is a transparent electrode made of ITO in this embodiment. Optionally, a sufficiently thin metal layer which makes ohmic contact with the p-type nitride semiconductor layer 23 may be interposed between the transparent electrode and the p-type nitride semiconductor layer 23. In this semiconductor light-emitting element 106, the p-type electrode 40 can cover the entire first principal surface 23*a* of the p-type nitride semiconductor layer 23, and therefore, low-resistance p-type ohmic contact is realized.

This semiconductor light-emitting element 106 may be fabricated in the following manner. First of all, as already described for the first embodiment, a semiconductor multilayer structure 20 is formed on the substrate 10 as shown in FIG. 18. Thereafter, the substrate 10 is polished until the overall thickness thereof becomes approximately 100 µm. Next, a striped structure 50 is formed on the first principal surface 23*a* of the p-type nitride semiconductor layer 23 and then electrodes are formed. First of all, a stack of Ti/Pt layers, for example, is formed as an n-type electrode 30 on the substrate 10. Meanwhile, an ITO layer, for example, is formed as a p-type electrode 40 on the striped structure 50. After that, a heat treatment process is carried out to alloy the Ti/Pt layers with the substrate 10 and the ITO layer with the p-type nitride semiconductor layer 23 and form an n-type electrode 30 and a p-type electrode 40 which are coupled to the substrate 10 and the p-type nitride semiconductor layer, respectively. In this manner, the semiconductor light-emitting element 106 shown in FIG. 18 is completed.

Embodiment 7

Figure 19:
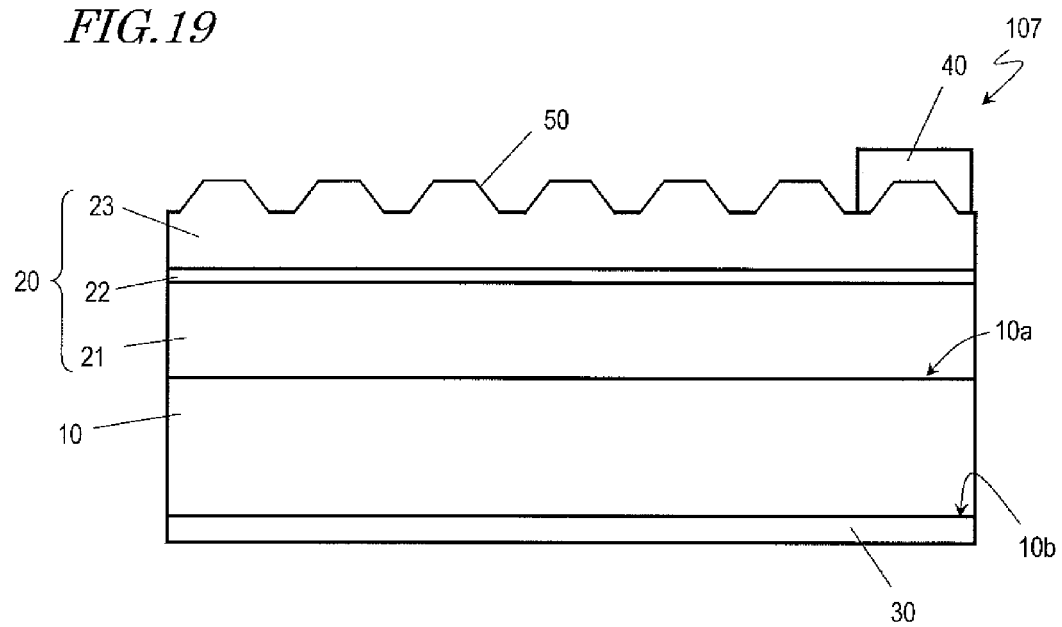
FIG. 19 is a schematic cross-sectional view illustrating a seventh embodiment of a semiconductor light-emitting element according to the present invention.

FIG. 19 schematically illustrates a cross-sectional structure of a semiconductor light-emitting element as seventh embodiment of the present invention. As shown in FIG. 19, the semiconductor light-emitting element 107 includes a substrate 10, a semiconductor multilayer structure 20 which has been formed on the first principal surface 10a of the substrate 10 and which includes an active layer region 22, an n-type electrode 30 and a p-type electrode 40.

In this semiconductor light-emitting element 107, the p-type electrode 40 covers only a part of the striped structure 50 on the first principal surface 23a of the p-type nitride semiconductor layer 23, which is a major difference from the sixth embodiment described above. By providing such a small p-type electrode 40, absorption of light into the p-type electrode 40 can be reduced, and the light extraction efficiency can be increased, compared to the sixth embodiment.

This semiconductor light-emitting element 107 may be fabricated in the following manner. First of all, as already described for the first embodiment, a semiconductor multilayer structure 20 is formed on the substrate 10 as shown in FIG. 19. Thereafter, the substrate 10 is polished until the overall thickness thereof becomes approximately 100 µm. Next, a striped structure 50 is formed on the first principal surface 23a of the p-type nitride semiconductor layer 23 and then electrodes are formed. First of all, a stack of Ti/Pt layers, for example, is formed as an n-type electrode 30 on the substrate 10. Meanwhile, a stack of Pd/Pt layers, for example, is formed as a p-type electrode 40 on only a part of the striped structure 50. After that, a heat treatment process is carried out to alloy the Ti/Pt layers with the substrate 10 and the Pd/Pt layers with the p-type nitride semiconductor layer 23 and form an n-type electrode 30 and a p-type electrode 40 which are coupled to the substrate 10 and the p-type nitride semiconductor layer, respectively. In this manner, the semiconductor light-emitting element 107 shown in FIG. 19 is completed.

EXAMPLES

To confirm the effects of the present invention, various semiconductor light-emitting elements were fabricated by the manufacturing process of the first embodiment and had their performance evaluated.

Making Example 1, Reference Example 1 and Comparative Example 1

First of all, as shown in FIG. 3, a semiconductor multilayer structure 20 was grown epitaxially on a substrate 10 by MOCVD (metalorganic chemical vapor deposition) process. Specifically, an n-type nitride semiconductor layer 21 was grown epitaxially on an n-type GaN substrate, of which the principal surface was an m plane. For example, using silicon as an n-type dopant and supplying TMG ($Ga(CH_3)_3$) and $NH_3$ as source gases to a reaction chamber, an n-type nitride semiconductor layer 21 of GaN was deposited to a thickness of 3 µm at a growing temperature of approximately 1050 degrees Celsius.

Next, an active layer region 22 was formed on the n-type nitride semiconductor layer 21. The active layer region 22 had a $Ga_{1-x}In_xN$/GaN multiple quantum well (MQW) structure in which $Ga_{1-x}In_xN$ well layers (where x=0.19), each having a thickness of 9 nm, and GaN barrier layers, each having a thickness of 9 nm, were stacked alternately. When the $Ga_{1-x}In_xN$ well layers were formed, the growing temperature was lowered to 800 degrees Celsius in order to introduce In.

Next, an undoped GaN layer (not shown) was deposited to a thickness of 30 nm on the active layer region 22. Subsequently, a p-type nitride semiconductor layer 23 was formed on the undoped GaN layer. Using $Cp_2Mg$ (cyclopentadienyl magnesium) as a p-type dopant and supplying TMG, TMA and $NH_3$ as source gases to a reaction chamber, a p-type nitride semiconductor layer 23 of $p-Al_{0.14}Ga_{0.86}N$ was deposited to a thickness of about 70 nm at a growing temperature of 1050 degrees Celsius. After that, a heat treatment process was carried out at approximately 830 degrees Celsius for 20 minutes.

Next, using $Cp_2Mg$ as a dopant, a p-GaN contact layer (not shown) was deposited to a thickness of 0.5 µm on the p-type nitride semiconductor layer 23.

Subsequently, by performing a dry etching process using a chlorine based gas, the p-GaN contact layer, the p-type nitride semiconductor layer 23, the undoped GaN layer, the active layer region 22 and the n-type nitride semiconductor layer 21 were partially removed to make a recess 31 and expose a part of the n-type nitride semiconductor layer 21.

Next, on that part of the n-type nitride semiconductor layer 21, which was exposed at the bottom of the recess 31, a stack of Ti/Pt layers was formed as the n-type electrode 30. Meanwhile, a stack of Pd/Pt layers was formed as the p-type electrode 40 on the p-GaN contact layer. After that, a heat treatment process was carried out to alloy the Ti/Pt layers with the n-type nitride semiconductor layer 21 and the Pd/Pt layers with the p-GaN contact layer and form an n-type electrode 30 and a p-type electrode 40 on the n-type nitride semiconductor layer 21 and on the p-GaN contact layer, respectively.

Thereafter, the substrate 10 was polished to reduce the overall thickness to 100 µm. In this manner, a portion functioning as a semiconductor light-emitting element was completed.

Next, a striped structure 50 was formed. First of all, an $SiO_2$ film was deposited as a hard mask material on the second principal surface 10b of the substrate 10. The $SiO_2$ film was deposited by plasma chemical vapor deposition process. Next, a photoresist for electron beam lithography was applied onto the hard mask and was patterned using an electron beam lithography system. Thereafter, using the electron beam lithography photoresist as a mask, the hard mask was dry-etched with $CF_4$ gas and $O_2$ gas. Next, using the hard mask as a mask, the second principal surface 10b of the substrate 10 was dry-etched using a chlorine based gas. Finally, the hard mask was removed by dry etching. In this manner, a semiconductor light-emitting element was completed.

Figure 27:
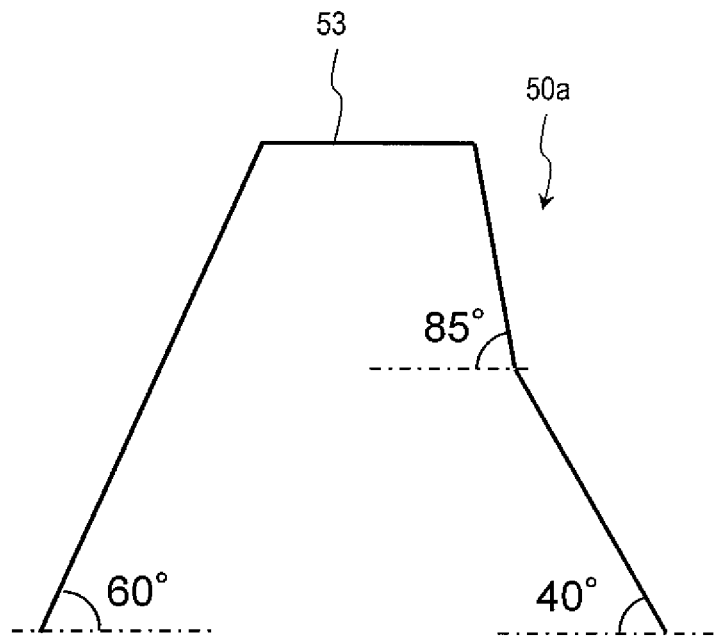
FIG. 27(a) schematically illustrates the cross-sectional shape of the striped structures of Examples 1 and 2, Reference Examples 1 and 2, and Comparative Examples 1 and 2 and (b) schematically illustrates the cross-sectional shape of the striped structures of Example 3 and Reference Example 3.
Figure 27:
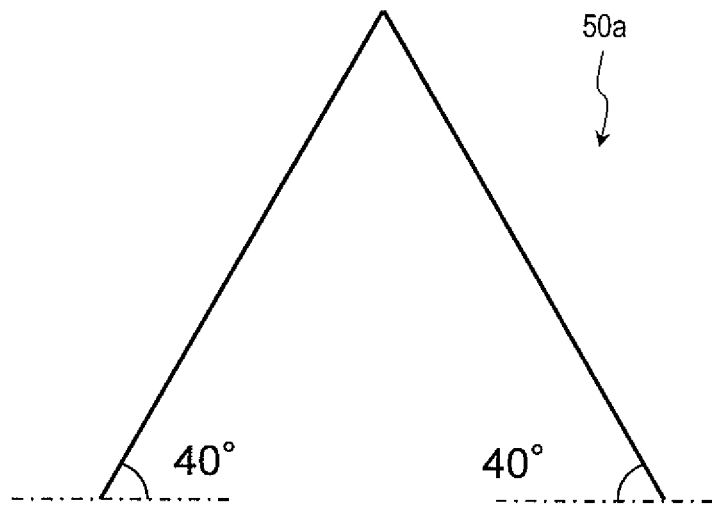

The striped structure had a pitch p of 300 nm and its height h was set to be 300 nm. Each of the stripes thus formed had a roughly trapezoidal cross-sectional shape. FIG. 27(a) is a schematic representation illustrating the cross-sectional shape. In this case, Example 1 in which the stripes ran parallel to the a-axis (i.e., β=0), Reference Example 1 in which the stripes defined an angle of 45 degrees with respect to the a-axis (i.e., β=45), and Comparative Example in which the stripes crossed the a-axis at right angles (i.e., β=90) were made.

Making Example 2, Reference Example 2 and Comparative Example 2

A portion functioning as a semiconductor light-emitting element was made in the same procedure as in Example 1, Reference Example 1 and Comparative Example 1. After that, a striped structure was made in a different procedure from in Example 1, Reference Example 1 and Comparative Example 1. Specifically, an $SiO_2$ film was deposited as a hard mask material on the second principal surface 10b of the substrate 10. The $SiO_2$ film was deposited by plasma chemical vapor deposition process. Next, a photoresist was applied onto the hard mask and was patterned using a contact exposure system. Thereafter, using the photoresist as a mask, the hard mask was dry-etched with $CF_4$ gas and $O_2$ gas. Next, using the hard mask as a mask, the second principal surface 10b of the substrate 10 was dry-etched using a chlorine based gas. Finally, the hard mask was removed by dry etching. In this manner, a semiconductor light-emitting element was fabricated.

The striped structure had a pitch p of 8 μm and its height h was set to be 4 μm. Each of the stripes thus formed had a roughly trapezoidal cross-sectional shape. FIG. 27(a) is a schematic representation illustrating the cross-sectional shape. In this case, Example 2 in which the stripes ran parallel to the a-axis (i.e., β=0), Reference Example 2 in which the stripes defined an angle of 45 degrees with respect to the a-axis (i.e., β=45), and Comparative Example 2 in which the stripes crossed the a-axis at right angles (i.e., β=90) were made.

Making Example 3, Reference Example 3 and Comparative Example 3

Semiconductor light-emitting elements, of which the striped structure defined angles β of 0, 5, 30, 45 and 90 degrees, respectively, with respect to the a-axis, were fabricated. First of all, a portion functioning as a semiconductor light-emitting element was made in the same procedure as in Example 1, Reference Example 1 and Comparative Example 1. After that, a striped structure was made in a different procedure from in Example 1, Reference Example 1 and Comparative Example 1. Specifically, a photoresist was applied onto the second principal surface 10b of the substrate 10 and was patterned using a contact exposure system and then heated to 230 degrees Celsius. Thereafter, using the photoresist as a mask, the second principal surface 10b of the substrate 10 was dry-etched using a chlorine based gas. In this process step, the photoresist was also removed at the same time as a result of the dry etching process. In this manner, a semiconductor light-emitting element was fabricated.

The striped structure had a pitch p of 8 μm and its height h was set to be 2.5 μm. By making the striped structure by the manufacturing process described above, a different cross-sectional shape from that of Example 2, Reference Example 2 and Comparative Example 2 could be obtained. Specifically, the striped structure thus formed had a roughly isosceles triangular cross-sectional shape. FIG. 27(b) is a schematic representation illustrating the cross-sectional shape. In this case, Example 3 in which the stripes ran parallel to the a-axis (i.e., β=0), Reference Example 3 in which the stripes defined angles of 5, 30 and 45 degrees with respect to the a-axis (i.e., β=5, 30, 45), and Comparative Example 3 in which the stripes crossed the a-axis at right angles (i.e., β=90) were made.

Making Comparative Example 4

A semiconductor light-emitting element, including every member of Example 1 but the striped structure 50, was fabricated as Comparative Example 4 in the same procedure as in Example 1.

Evaluating the Performances of Examples 1 and 2, Reference Examples 1 and 2 and Comparative Examples 1 to 3

Figure 20:
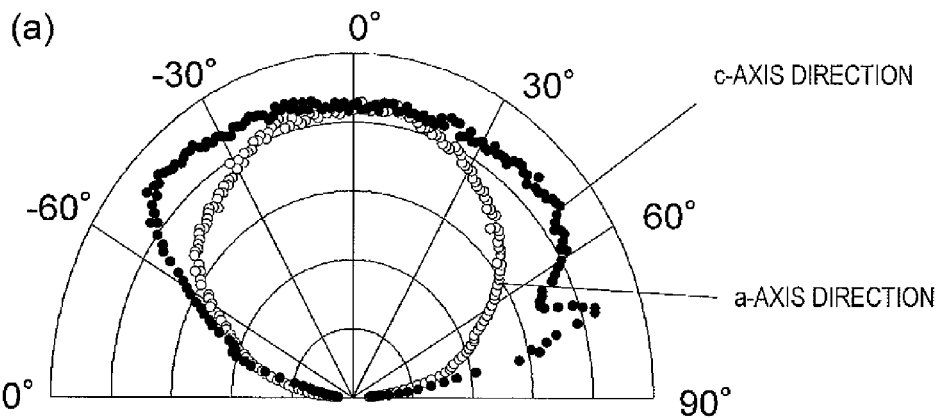
FIG. 20(a) shows the light distribution characteristic of a semiconductor light-emitting element having a flat light-emitting face and (b) and (c) schematically illustrate the results shown in (a).
Figure 20:
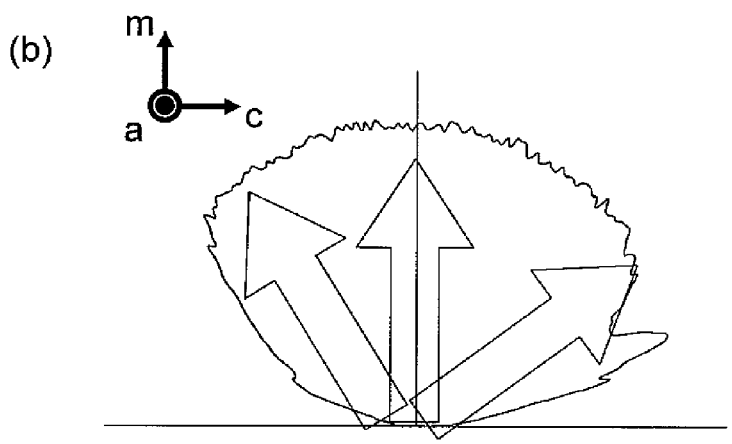
Figure 20:
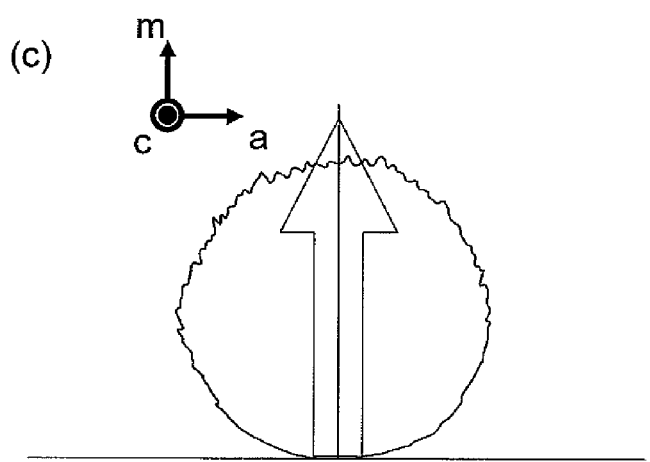
Figure 21:
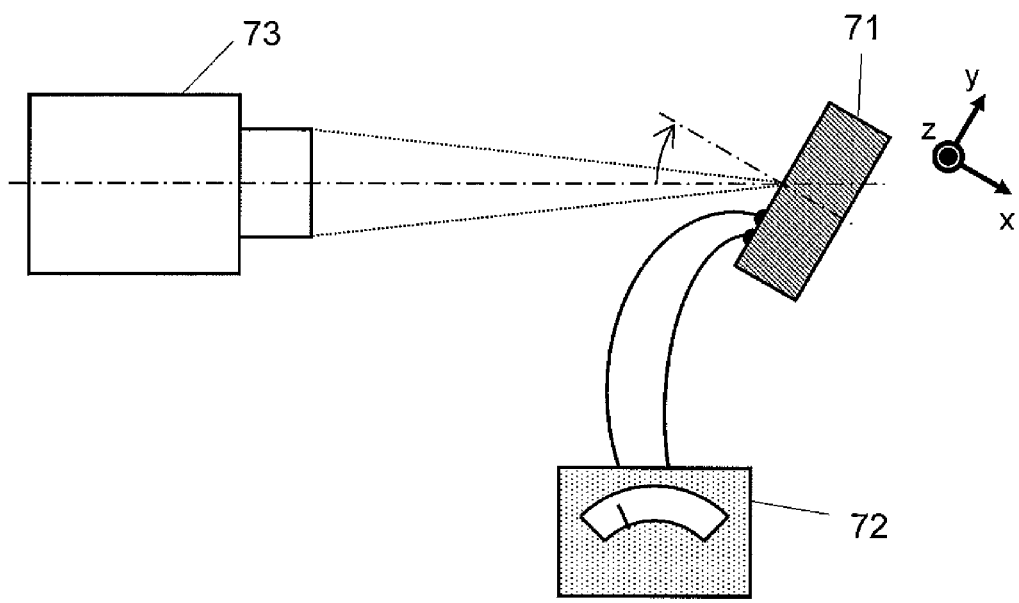
FIG. 21 illustrates the arrangement of a measuring system which was used to measure the light distribution characteristic.

The performances of the semiconductor light-emitting elements thus fabricated were evaluated. To confirm that most of the propagation vectors k were present within a plane parallel to the mc plane (see FIG. 9), the light distribution characteristic of the semiconductor light-emitting element of Comparative Example 3 was measured. FIG. 20(a) is a graph showing the results of measurement of the light distribution characteristic. FIG. 21 schematically illustrates the arrangement of a system that was used for measurement. The semiconductor light-emitting element of Comparative Example 4 was flip-chip bonded and was used for measurement as a light-emitting element chip 71. By supplying current from a power supply 72 to the light-emitting element chip 71, light was emitted. The light-emitting element chip 71 was rotated on the z-axis shown in FIG. 21 and the light intensity was measured with a photodetector 73. The a-axis shown in FIG. 20(a) is a result of measurement obtained by defining the x-, y- and z-axes shown in FIG. 21 to be m-, a- and c-axes, respectively. The c-axis shown in FIG. 20(a) is a result of measurement obtained by defining the x-, y- and z-axes shown in FIG. 21 to be m-, c- and a-axes, respectively.

As can be seen from FIG. 20(a), the light intensity has a strong light distribution characteristic over a wider angle in the c-axis direction than in the a-axis direction. That is to say, the angle of radiation is wider in the c-axis direction than in the a-axis direction and the light distribution characteristic has a degree of asymmetry. FIGS. 20(b) and 20(c) schematically illustrate the results shown in FIG. 20(a). In FIG. 20(b), the light traveling in the mc plane is illustrated schematically, and it can be seen that intense light is emitted over a wide range in the mc plane. On the other hand, in FIG. 20(c), the light traveling in the ma plane is illustrated schematically, and it can be seen that intense light is emitted in the m-axis direction. Also, there is little light with the a-axis direction component. In this case, the light emitted in the m-axis direction is shared by the mc plane and the ma plane. These results reveal that the light produced is mostly present within the mc plane.

Figure 22:
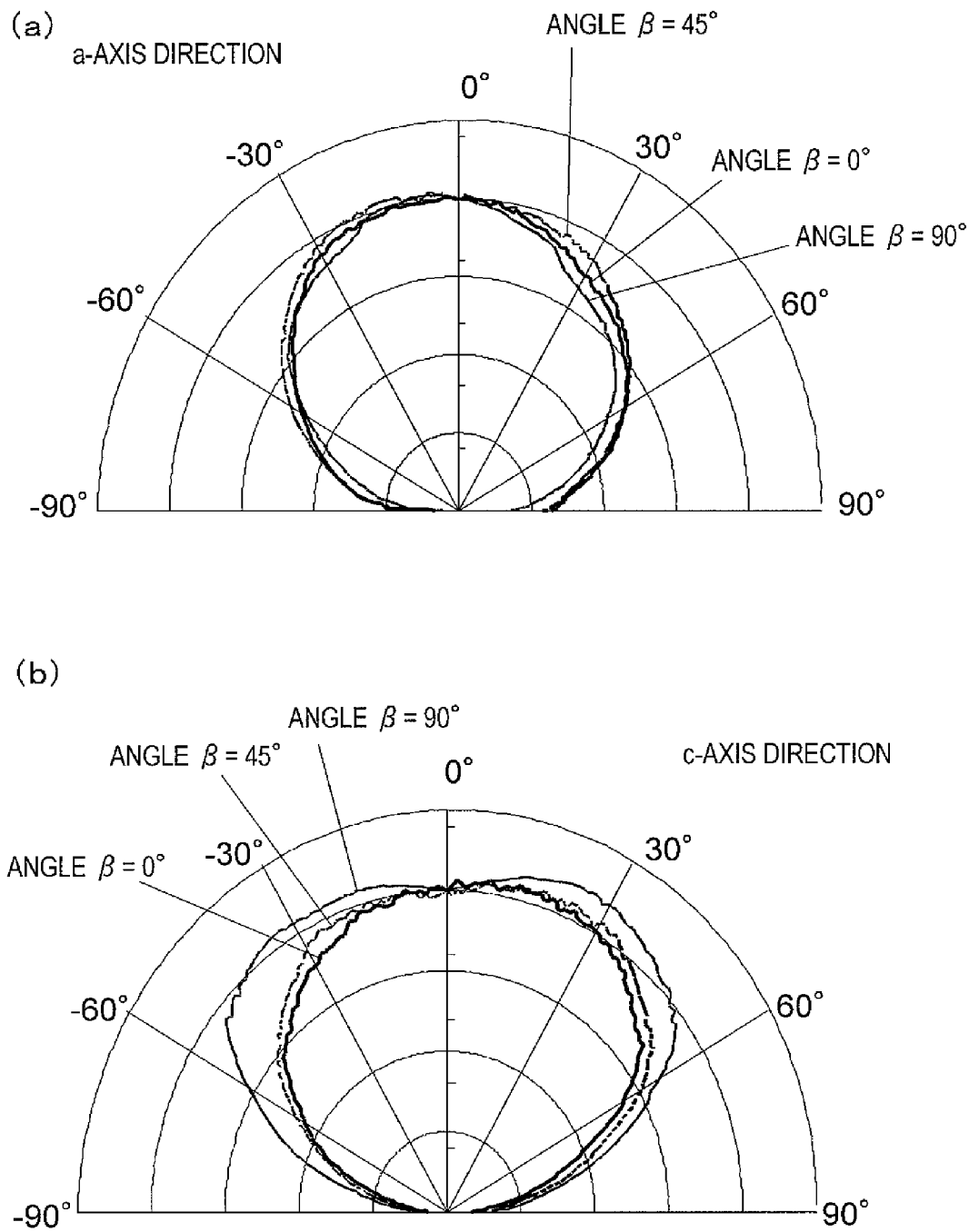
FIG. 22 shows the relation between the orientation of the striped structure and the light distribution characteristic, wherein (a) shows the light distribution characteristic in the a-axis direction and (b) shows the light distribution characteristic in the c-axis direction.

Next, the light distribution characteristics of the semiconductor light-emitting elements of Example 1, Reference Example 1 and Comparative Example 1 were measured. The system used for measurement also has the arrangement shown in FIG. 21. FIG. 22 is a graph showing the results of measurement of the light distribution characteristics of the semiconductor light-emitting elements of Example 1 (β=0), Reference Example 1 (β=45) and Comparative Example 1 (β=90). FIG. 22(a) shows the results of measurement obtained in the a-axis direction and FIG. 22(b) shows the results of measurement obtained in the c-axis direction. In this case, the a-axis direction is a result of measurement obtained by defining the x-, y- and z-axes shown in FIG. 21 to be m-, a- and c-axes, respectively. The c-axis direction is a result of measurement obtained by defining the x-, y- and z-axes shown in FIG. 21 to be m-, c- and a-axes, respectively. As can be seen from FIG. 22(a), the light distribution characteristic in the a-axis direction does not depend on the angle β. It can also be seen that the light distribution characteristic in the c-axis direction, on the other hand, is that the closer to zero degrees the angle β, the greater the percentage of the light intensities in the vicinity of zero degrees, i.e., in the m-axis direction. That is to say, it can be seen that the closer to zero degrees the angle β, the more similar the respective light distribution characteristics in the a- and t-axis directions get. These results reveal that in the semiconductor light-emitting element of Example 1, the degree of asymmetry of the light distribution characteristic was reduced.

Figure 23:
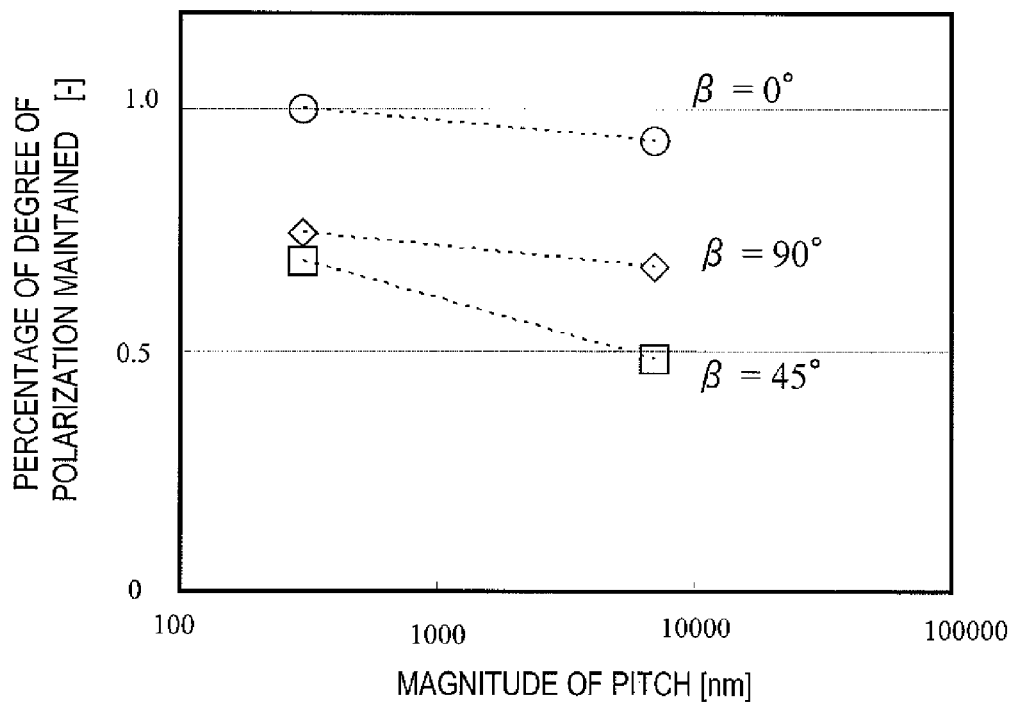
FIG. 23 is a graph showing relations between the pitch of the striped structure of the semiconductor light-emitting elements of Examples 1 and 2, Reference Examples 1 and 2, and Comparative Examples 1 and 2 and the percentage of the degree of polarization maintained.

Next, the present inventors confirmed how much degree of polarization was maintained in the polarized light emitted. FIG. 23 shows the results of measurements on the relation between the pitch p of the striped structure 50, the angle β, and the percentage of the degree of polarization maintained. In this case, the "semiconductor light-emitting element S" is a generic term that collectively refers to Examples 1 and 2, Reference Examples 1 and 2, and Comparative Examples 1 and 2. Also, the "percentage of the degree of polarization maintained" refers to how much degree of polarization was maintained with respect to the degree of polarization of Comparative Example 4 with no striped structure and is calculated by the following Equation (7):

(percentage of degree of polarization maintained)=
(degree of polarization of semiconductor light-
emitting element S)/(degree of polarization of
comparative example)                                    (7)

Figure 24:
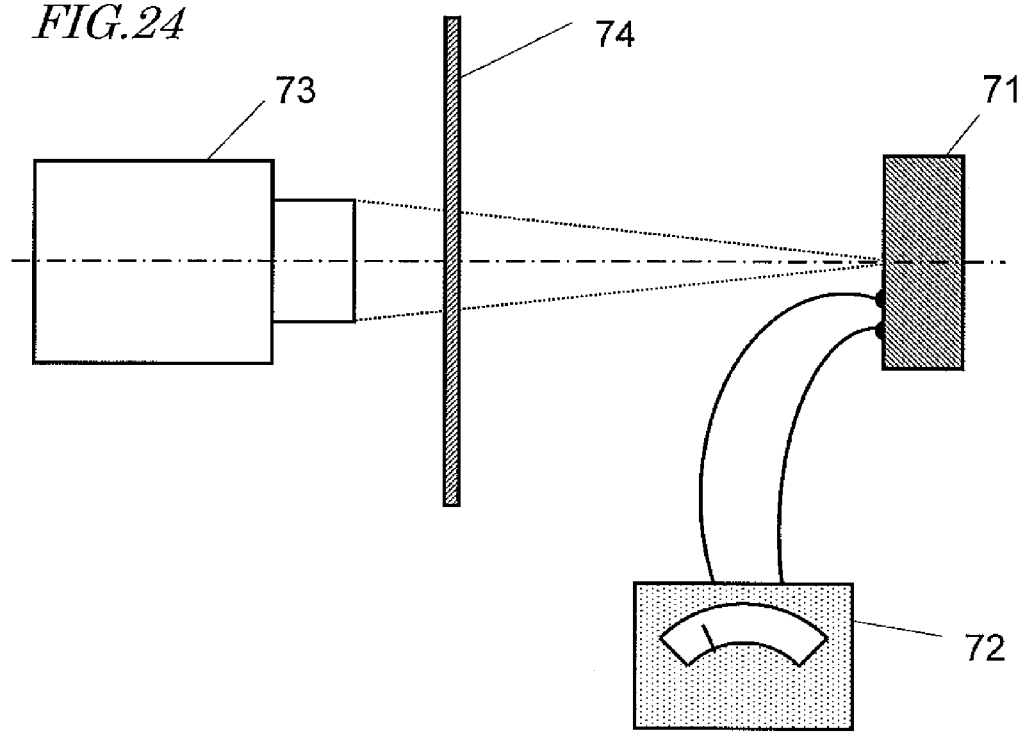
FIG. 24 illustrates the arrangement of a measuring system which was used to measure the degree of polarization.

FIG. 24 schematically illustrates the arrangement of a system that was used for measurement. Either the semiconductor light-emitting element S or the semiconductor light-emitting element of Comparative Example 4 was flip-chip bonded and was used as a light-emitting element chip 71 for measurement. By supplying current from the power supply 72 to the light-emitting element chip 71, light was emitted. The light emitted from the light-emitting element chip 71 was transmitted through a polarizer 74 and had its intensity detected by a photodetector 73. If the light emitted from the light-emitting element chip 71 included polarized light, a variation in the intensity of the light would be observed by rotating the polarizer 74.

As can be seen from FIG. 23, if the angle β was zero degrees in the striped structure with a pitch of at least 300 nm to 8 μm, the degree of polarization was maintained well even with the pitch increased. It can also be seen that if the angles β were 45 and 90 degrees, on the other hand, the degree of polarization decreased to approximately 70%.

Figure 26:
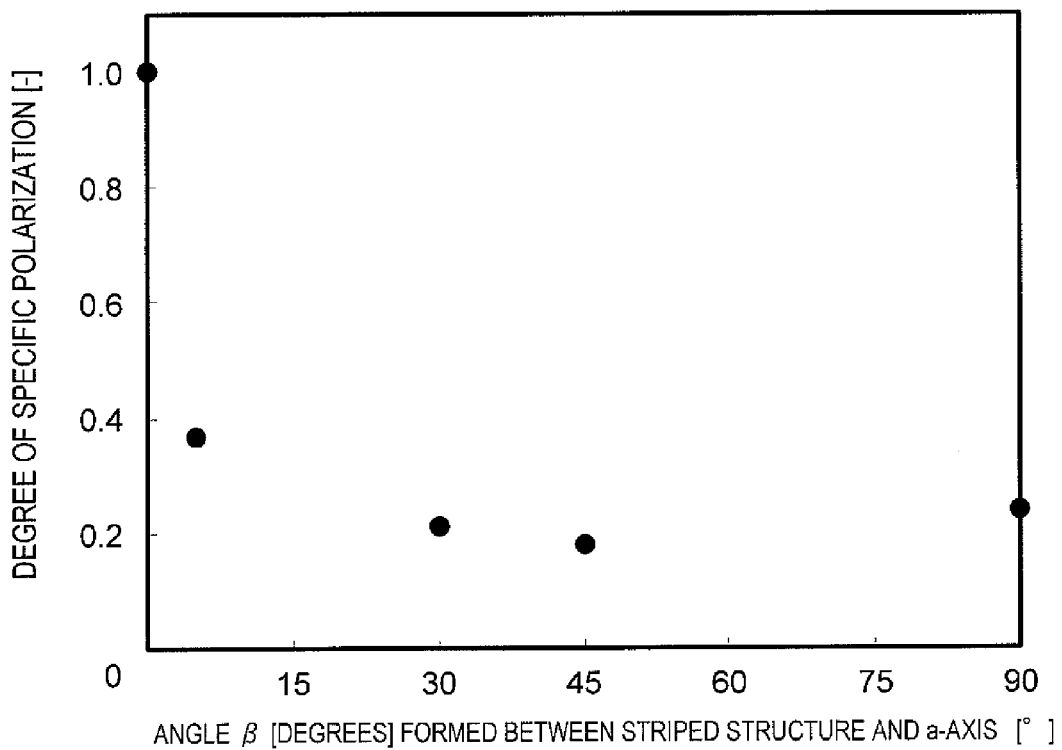
FIG. 26 is a graph showing relations between the angles β of the respective striped structures of the semiconductor light-emitting elements of Example 3, Reference Example 3 and comparative example 3 and the degree of specific polarization.

To inspect the relation between the angle β and the degree of polarization more closely, the degrees of polarization of the semiconductor light-emitting elements of Example 3, Reference Example 3 and Comparative Example 3 were measured. FIG. 26 shows the results of measurement obtained in Example 3, Reference Example 3 and Comparative Example 3. The results of measurement were evaluated as degrees of specific polarization. In this description, the "degree of specific polarization" refers to a value obtained by normalizing the degree of polarization of Reference Example 3 or Comparative Example 3 with that of Example 3 and is calculated by the following Equation (8):

(degree of specific polarization)=(degree of polariza-
tion of Reference Example 3 or Comparative
Example 3)/(degree of polarization of Example
3)                                                      (8)

As can be seen from FIG. 26, if the angle β was 5 degrees or more, the degree of polarization decreased significantly to 0.4 or less. The degree of polarization decreased most significantly when the angle β was 45 degrees. However, when the angles β were 30 degrees and 90 degrees, the degree of polarization did not decrease so much as when the angle β was 45 degrees. The results shown in FIG. 26 reveal that the polarization property would be maintained well if the angle β is within ±3 degrees.

According to the results of measurement shown in FIG. 23, the percentage of the degree of polarization maintained was 50% or more at angles β of 45 and 90 degrees. According to the results of measurement shown in FIG. 26, on the other hand, the percentage of the degree of polarization maintained was approximately 20% at angles β of 45 and 90 degrees. This difference would be caused by a difference in cross-sectional shape between them.

More specifically, in the semiconductor light-emitting element from which the results of measurement shown in FIG. 23 were obtained, the cross-sectional shape of each projection 53a of its striped structure has an upper surface 53 as shown in FIG. 27(a), and the quantity of the polarized light extracted through the upper surface 53 does not depend on the direction in which the projection 53a runs, i.e., does not depend on the angle β. That is why in the semiconductor light-emitting element, from which the results of measurement shown in FIG. 23 were obtained, if the angle β is greater than zero degrees, the degree of polarization of the outgoing light would be kept relatively high. On the other hand, in the semiconductor light-emitting element from which the results of measurement shown in FIG. 26 were obtained, the cross-sectional shape of each projection 53a of its striped structure has no upper surface as shown in FIG. 27(b), and therefore, it would be difficult to maintain the degree of polarization.

As can be seen, the dependence of the percentage of the degree of polarization maintained on the angle β varies according to the cross-sectional shape of each projection of the striped structure. However, even in the semiconductor light-emitting element with such a striped structure in which the projection 53a has no upper surface 53 but has a triangular cross section in which the percentage of the degree of polarization maintained depends on the angle β most heavily, the polarization property can also be maintained well enough if the angle β is ±3 degrees as shown in FIG. 26. Consequently, it can be said that no matter what cross-sectional shape (e.g., any of the ones shown in FIGS. 4(a), 5(a), 5(b) and 5(c)) each projection 53a of the striped structure of the semiconductor light-emitting element has, as long as the angle β is within ±3 degrees, the polarization property of the polarized light emitted from the semiconductor light-emitting element can be maintained well.

Figure 25:
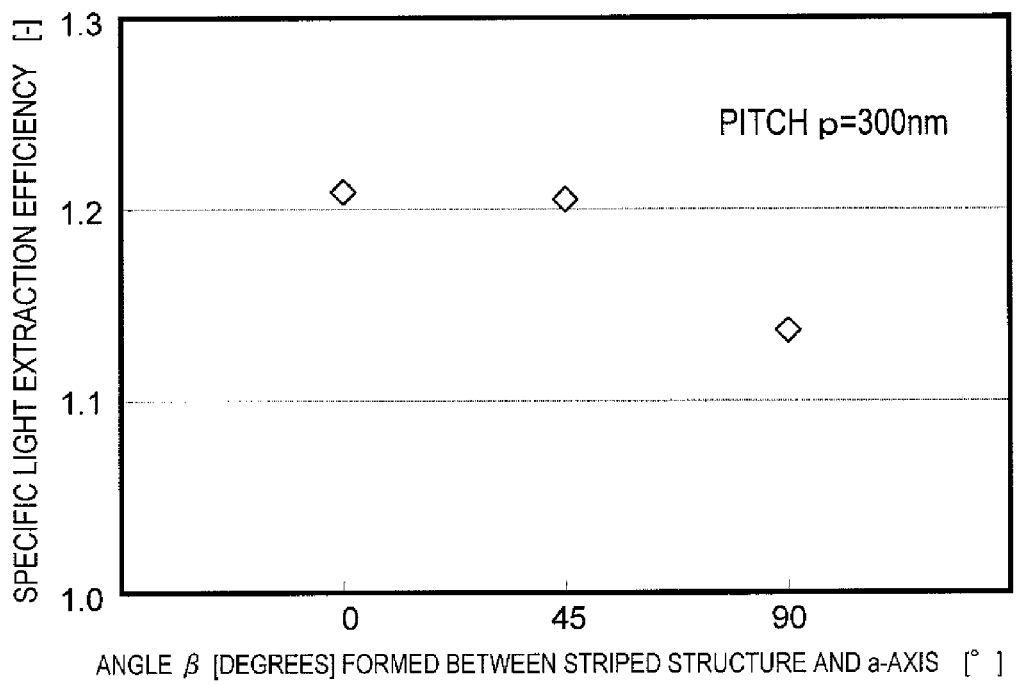
FIG. 25 is a graph showing relations between the angles defined by the respective striped structures of the semiconductor light-emitting elements of Example 1, Reference Example 1 and Comparative Example 1 with respect to the a-axis and the light extraction efficiency.

Next, the light extraction efficiencies were checked out. FIG. 25 shows the results of measurement obtained from the semiconductor light-emitting elements of Example 1, Reference Example 1 and Comparative Example 1 on the relation between the specific light extraction efficiency and the angle β. In this description, the "specific light extraction efficiency" refers to a value obtained by normalizing the light extraction efficiency of the semiconductor light-emitting element of Example 1, Reference Example 1 or Comparative Example 1 with that of the semiconductor light-emitting element having a flat light-emitting face of Comparative Example 4. As can be seen from FIG. 25, by forming the striped structure 50 on the flat light-emitting face 14, the specific light extraction efficiency becomes greater than one, specifically, 1.1 or more. Particularly, when the angles β are 0 degrees and 45 degrees, the specific light extraction efficiency becomes 1.2 or more, and it can be seen that the light extraction efficiency increased significantly.

As can be seen, the semiconductor light-emitting element according to this embodiment of the present invention can reduce the degree of asymmetry of the light distribution characteristic as shown in FIG. 22, can maintain the polarization property of the polarized light well as shown in FIG. 23, and can increase the light extraction efficiency significantly as shown in FIG. 25. Thus, the semiconductor light-emitting element according to this embodiment of the present invention turned out to be usable as a light source with good polarization property, high efficiency and good light distribution characteristic.

INDUSTRIAL APPLICABILITY

The semiconductor light-emitting element of the present invention has high light extraction efficiency, a good degree of polarization, and good light distribution characteristic, and can be used as any of various light sources that emit polarized light. The semiconductor light-emitting element of the present invention can be used particularly effectively as a high-efficiency, low-cost illumination unit or light source for a liquid crystal display device by utilizing its polarization property.

REFERENCE SIGNS LIST 10 substrate
13 light output member
14 flat light-emitting face
20 semiconductor multilayer structure
21 n-type nitride Semiconductor layer
22 active layer region
23 p-type nitride semiconductor layer
30 n-type electrode
31 recess
40 p-type electrode
50 striped structure
50a projection
50b groove
52 slope
53 upper surface
54 plane that is parallel to ac plane
55 line of intersection between plane 54 and slope
56 cross-sectional shape of striped structure 50
60 plane that is parallel to mc plane
71 light-emitting element chip
72 power supply
73 photodetector
74 polarizer
101, 102, 103, 104, 105, 106, 107 semiconductor light-emitting element

The invention claimed is:
1. A semiconductor light-emitting diode comprising:
a substrate;
an n-type nitride semiconductor layer;
a p-type nitride semiconductor layer;
an active layer region which includes an m plane nitride semiconductor layer and which is interposed between the n-type nitride semiconductor layer and the p-type nitride semiconductor layer;
an n-type electrode which is electrically connected to the n-type nitride semiconductor layer;
a p-type electrode which is electrically connected to the p-type nitride semiconductor layer;
a light-emitting face, through which polarized light that has been produced in the active layer region is extracted out of the nitride semiconductor light-emitting element; wherein
the substrate has a first principal surface and a second principal surface;
the first principal surface of the substrate is opposite to the second principal surface of the substrate;
the n-type nitride semiconductor layer has a first surface, a second surface, and a third surface;
the third surface of the n-type nitride semiconductor layer is opposite to the first and second surfaces of the n-type nitride semiconductor layer;
the first surface of the n-type nitride semiconductor layer is in contact with the active layer region;
the second surface of the n-type nitride semiconductor layer is in contact with the n-type electrode;
the third surface of the n-type nitride semiconductor layer is in contact with the first principal surface of the substrate;
the second principal surface of the substrate is the light-emitting face;
the second principal surface of the substrate is not in contact with an electrode; and
the second principal surface of the substrate has a striped structure which is provided for the light-emitting face and which has a plurality of projections that run in a direction within ±3 degrees of the a-axis direction of the m plane nitride semiconductor layer, wherein each of the plurality of projections has at least one sloped sidewall which is not parallel to the light-emitting face.

2. The semiconductor light-emitting diode of claim 1, wherein the plurality of projections have a period of 300 nm to 8 μm.

3. The semiconductor light-emitting diode of claim 2, wherein the polarized light is produced in the active layer region so as to have a light distribution characteristic, of which the angle of radiation is wider in a c-axis direction than in the a-axis direction.

4. The semiconductor light-emitting diode of claim 3, wherein the substrate is formed of GaN.

5. The semiconductor light-emitting diode of claim 1, wherein each of the plurality of projections further comprises an end surface parallel to the light-emitting face.

* * * * *